(12) United States Patent
Muljono et al.

(10) Patent No.: US 7,036,055 B2
(45) Date of Patent: Apr. 25, 2006

(54) ARRANGEMENTS FOR SELF-MEASUREMENT OF I/O SPECIFICATIONS

(75) Inventors: Harry Muljono, Union City, CA (US); Yanmei (Kathy) Tian, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 387 days.

(21) Appl. No.: 10/334,070

(22) Filed: Dec. 31, 2002

(65) Prior Publication Data

US 2004/0128601 A1  Jul. 1, 2004

(51) Int. Cl.
*G01R 31/28* (2006.01)
*G01R 31/08* (2006.01)

(52) U.S. Cl. ..................... 714/716; 370/249
(58) Field of Classification Search ........... 714/700, 714/744, 738, 798, 712, 716, 717; 713/400, 713/401, 500, 503; 370/249, 248
See application file for complete search history.

(56) References Cited

U.S. PATENT DOCUMENTS

| 5,621,739 A | 4/1997 | Sine et al. ............ 714/724 |
| 6,040,714 A * | 3/2000 | Klein ..................... 326/86 |

\* cited by examiner

*Primary Examiner*—Guy Lamarre
*Assistant Examiner*—John J. Tabone, Jr.
(74) *Attorney, Agent, or Firm*—LeMoine Patent Services, PLLC

(57) ABSTRACT

Arrangements (circuits, methods, systems) having self-measurement of input/output (I/O) specifications (e.g., input trip-point, output drive-level and pin leakage).

20 Claims, 15 Drawing Sheets

ARRANGEMENTS FOR SELF-MEASUREMENT OF I/O SPECIFICATIONS

CROSS-REFERENCE TO RELATED APPLICATIONS

Attention is directed to U.S. patent application Ser. No. 10/112,638, filed on Mar. 29, 2002, entitled "A METHOD AND APPARATUS FOR PRECISE SIGNAL INTERPOLATION", having inventors Eddie Y. WANG and Harry MULJONO, which may be related to the present application.

Further, the present application is a continuation-in-part (CIP) application of prior U.S. patent application Ser. No. 10/162,671, filed on Jun. 6, 2002, entitled "ARRANGEMENTS FOR SELF-MEASUREMENT OF I/O TIMING", having inventors Harry MULJONO and Alper ILKBAHAR.

FIELD

The present invention is directed to arrangements for self-measurement of input/output (I/O) specifications (e.g., input trip-point, output drive-level and pin leakage).

BACKGROUND

Manufacturers of semiconductor chips often perform extensive testing of the functionality of each chip before shipping it to its customers. This is important to the customer, since the use of a bad chip may ruin a larger assembly. The testing may involve a number of different parameters and functions of the chip, such as pin timing parameters. Due to increasingly stringent specifications of pin timing, the testing of these parameters and functions is becoming more difficult and more involved, and may require the use of increasingly expensive testing equipment (i.e., $3 million function testers verses $250K structural testers).

In addition, as the bus speeds increase, it becomes increasingly difficult and expensive for testing equipment (built with prior generation (slower) chips) to test the faster functions of a newer generation (faster) chip. Accordingly, it would be helpful to be able to test the chip without resorting to external testing equipment, such as by performing internal tests, so that expensive testing equipment can be avoided or use thereof minimized, and so that newer generation chip speeds do not impact testing.

One concept useable in this regard is called I/O loop-back (IOLB) testing. In this arrangement, an output pad is connected to an output latch through a driver, and also connected to an input latch through a buffer, so as to form a loop-back path. In order to test the speed of the device, the time required to send the data out and receive it back via the loop-back path is determined. This also tests data integrity, i.e., whether the output latch and input latch correctly output and input the applied signals.

One such type of system was used in U.S. Pat. No. 5,621,739, which shows a method for a buffer self-test. The buffer circuit utilizes an adjustable delay circuit to test whether the buffer can capture a data value during a variable strobe window. A self-testing buffer circuit generates a data value, and a latch then receives such data value. An adjustable delay circuit provides an adjustably delayed strobe to a clock input of the latch. A comparison circuit compares the latch output value to an expected value. A failure is indicated when the value is not that which is expected.

While these kinds of systems avoid some of the previously noted problems, they still have not been completely successful in removing all of these problems. One of the unsolved problems is related to the use of different clock domains for generating test data and test strobe. As a result, the data and strobe can only be exercised in a single-shot, non-repetitive manner. To guarantee correct operation, the logic has to ensure proper alignment between the clocks that generate the test data and strobes. Running the test operation during clock misalignment may cause failures that are not the fault of the chip being tested. Thus, good chips may be thrown out as being defective, or the ability to test the device must be limited so that these errors are not introduced.

Further, needed are improved arrangements for on-die self-measurement of I/O specifications (e.g., dc verses ac specifications).

BRIEF DESCRIPTION OF THE DRAWINGS

A better understanding of the present invention will become apparent from the following detailed description of example embodiments and the claims when read in connection with the accompanying drawings, all forming a part of the disclosure of this invention. While the following written and illustrated disclosure focuses on disclosing example embodiments of the invention, it should be clearly understood that the same is by way of illustration and example only and that the invention is not limited thereto. The spirit and scope of the present invention are limited only by the terms of the appended claims.

The following represents brief descriptions of the drawings, wherein.

DETAILED DESCRIPTION

Figure 1:
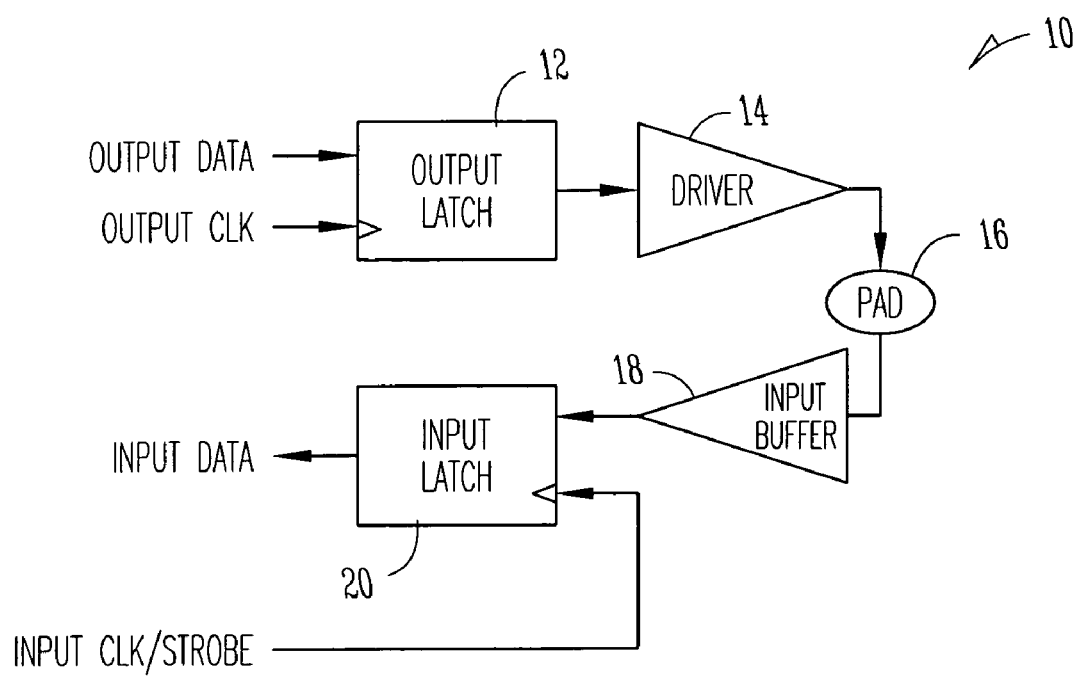
FIG. 1 is an example background arrangement useful in gaining a more thorough understanding of the present invention.

Before beginning a detailed description of the present invention, mention of the following is in order. When appropriate, like reference numerals and characters may be used designate identical, similar or corresponding components in differing Figure drawings. Further in the detailed description to follow, example sizes, values, ranges and models may be given although the present invention is not limited to the same. Well-known power and ground connections to ICs and other components may not be shown within the Figures for simplicity of illustration and discussion and so as not to obscure the invention. Further, arrangements may be shown in block diagram form in order to avoid obscuring the invention and also in view of the fact that specifics with respect to implementation of such block diagram arrangements are highly dependent on the platform within which the present invention is to be implemented, i.e., such specifics should be well within the purview of one skilled in the art. Where specific details are set forth in order to describe an example embodiment of the invention, it should be apparent to one skilled the art that the invention can be practiced without, or with variation of, these specific details. Finally, it should be apparent the differing combinations of hard-wired circuitry and software instructions may be used to implement embodiments of the present invention.

Although example embodiments of the present invention will be described using, for example, system block diagrams in a semiconductor integrated circuit (IC) chip environment, practice of the invention is not limited thereto, e.g., the invention may be able to be practiced using differing block/circuit arrangements.

While FIGS. 10–19 (discussed ahead) are more directly related with discussions concerning the present invention, FIGS. 1–9 provide useful background teaching which assist in a greater understanding/appreciation of the present invention. Accordingly, the initial part of this detailed discussion focuses on FIGS. 1–9.

FIG. 1 shows an example background I/O loop-back (iolb) circuit for one input/output (I/O) pad of a device (e.g., IC chip), where such circuit may be implemented using semiconductor structures (e.g., doping, logic components, metal wiring, etc.). Whereas in practice a device may contain several tens and even several hundreds of I/O pads, for the sake of brevity and clarity, FIG. 1 focuses only on one pad. Thus, it should be understood that the FIG. 1 loop-back circuit may be applied to all or fewer than all of the I/O pads of a device.

In this figure, the device 10 shows an output latch 12 receiving inputs of both data and clock signals. The output latch latches the data signal under the control of the clock signal and generates an output that is received by a driver 14. The driver outputs the signal to the output pad 16. This signal is also looped-back to an input buffer 18. The signal is then latched into an input latch 20 under the control of an input clock strobe signal to generate the input data signal. In doing this, it is possible (e.g., utilizing an appropriate comparison arrangement such as a comparator) to check to see that the latched input data matches output data that was sent to the output latch. Thus, this arrangement does not directly measure any specific timing specification but only measures the combination of the output delay, the loop path delay and the input delay.

Figure 2:
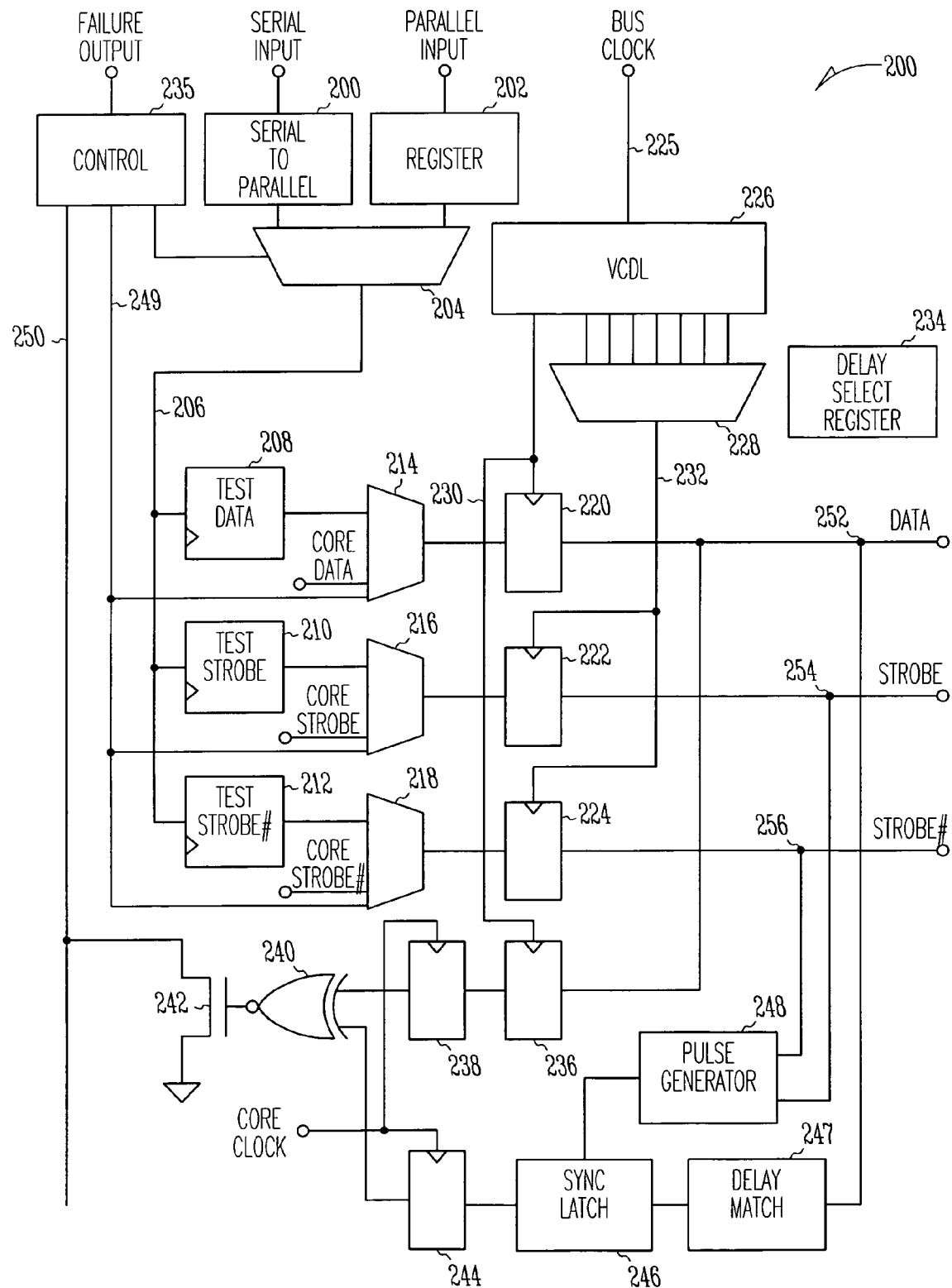
FIG. 2 is another example background arrangement useful in gaining a more thorough understanding of the present invention.

FIG. 2 is an example background arrangement 200 useful in gaining a more thorough understanding of the present invention. In this system, a buffer is tested by using a strobe signal to create a window during which data should be able to be captured. An adjustable delay circuit is used to test whether the buffer can capture a data value during a variable strobe window. In this system a control device 235 controls a multiplexer 204 to couple a serial input from a serial-to-parallel converter 200 or a parallel input from a register 202, to the test register bus 206. This bus couples to the input of a plurality of test registers 208, 210 and 212. Test register 208 is coupled by multiplexer 214 to an output circuit indicated by latch 220. A control signal 249 from the control circuit causes the multiplexer to make the connection during the test mode. Likewise, multiplexer 216 connects the test strobe register 210 and latch 222, while multiplexer 218 connects test strobe # register 212 and latch 224 during the test mode, with both the multiplexer 216 and 218 also being controlled by a control signal 249 from the control 235.

Output circuits 220, 222 and 224 may be any type of buffer or latch that drives an output signal in response to a clock, strobe or enable signal. Latch 220 drives a value from the data test register 208 to the node 252 as data, in response to a first I/O clock on line 230. The strobe and strobe# signals are driven from register 210 and 212 to nodes 254 and 256 in response to a second I/O clock line 232. The clock signals are derived from a bus clock provided on line 225. A voltage controlled delay line (VCDL) 226 acts as an adjustable delay circuit to skew the second clock relative to the first by adjustably delaying the second clock. A multiplexer 228 use a value from the delay select register 234 to select an output from one of a plurality of stages of the delay line as the second clock. Thus, the timing of the strobe and strobe # signals at nodes 254 and 256 is controlled by selecting a particular tap in the delay line.

The variably delayed strobe and strobe# signals are provided to pulse generator 248 which provides pulses to a synchronizing latch circuit 246. A delay matching circuit 247 may be coupled between the node 252 and the synchronizing latch 246 circuit to compensate for any pulse generator delay in the strobe signal paths.

In order to capture the incoming data from the node 252, the pulse generator circuit 248 provides a plurality of pulses to a series of latching circuits inside the synchronizing latch 246 circuit. The strobe and strobe # signals are used to generate rising and falling edges of each of the plurality of pulses to provide a more reliable capture window. Each pulse is delayed slightly with respect to previous one. Latch circuits within the synchronizing latch circuit are coupled to a core-clocked latch 244, which receives a core clock signal. The latching circuits are sequentially selected using a multiplexer to provide synchronized incoming data to the latch 244.

A latch 238 is also clocked by the core clock signal. Latch 238 contains an expected value by feeding back the data value from a test feedback latch 236 that couples the test data from a node prior to node 252. An exclusive nor gate 240 receives values from latches 238 and 244. If the values do not match, transistor 242 provides an indication of failure on the failure indication line 250. Responsive to a failure on the failure indication line 250, the control block 235 can output a failure output.

The buffer may be tested over a range of delays to provide complete information about the chip. Thus, the adjustable delay circuit can cause (emulate) failures due to a strobe signal that is either too early or too late. Both the input setup and hold times (both sides of the capture window) can be tested. An entire range of delays can be tested for an I/O buffer if desired. It may be desirable to vary the delay control signal until the input latch fails to capture the input. This may be useful in defining production test specifications. Accordingly, this type of system may be very useful in testing compliance with specifications of the buffers on a device (e.g., chip).

The disadvantageous arrangement described in FIG. 2 has limitations because of the use of the bus strobe clock. When changing the delay in order to change the strobe window between the bus strobe clock and the core clock that is used to toggle latches 208, 210 and 212, the setup and hold time of the test data and test strobe at latch 220, 222 and 224 may be violated which can cause the chip to fail through no fault of its own. That is, there are multiple clock domains in use within iolb operations of the FIG. 2 iolb arrangement. As result, the amounts of delay that are available for testing may be limited or good chips may fail unnecessarily.

In addition, the arrangement in FIG. 2 also allows only one-shot, one-bit testing patterns. To exercise another pattern, test data and test strobe registers have to be reloaded with a new pattern, extending the testing time unnecessarily FIGS. 3–9 avoid ones of the above-mentioned timing problems by avoiding the use of a system bus strobe clock (i.e., uses a locally-generated non-system-bus-clock) for test data and test strobe within the iolb circuit. This allows the entire iolb operation to be done in one local (i.e., a common) clock domain. Also, since the timing loop may be locked to a constant test frequency, there are no changes in silicon variables such as PVT (process, voltage, temperature) that may affect the strobe timing.

With this type of arrangement, it becomes possible to utilize multiple test patterns, rather than being limited to a single test pattern as in FIG. 2. That is, a pattern generator register may be provided to service each pin, so that multiple patterns may be generated and used without extending any testing time for reloading.

Thus, a purpose of such embodiments is to add a capability to the chip to do a self-measurement of I/O timing and to test for buffer defects without the need for separate external testing equipment. During measurement, dedicated data and strobe clocks within a single time domain as generated by a dedicated local (iolb) time locked loop (TLL) such as a delay locked loop (DLL), may be used to trigger the output data and strobe transitions. The term dedicated, as used within the previous sentence, means that the TLL and iolb data and strobe clocks are used mainly to service the iolb arrangement/operations, but they may also be used for some secondary purposes. As further evidence of the iolb-specialized nature of the clock component/signals, the TLL and iolb data and strobe clocks may be rendered inactive during non-iolb times.

Continuing discussions, by varying the strobe clock in relation to the data clock, it is possible to determine at what points the latches start to fail and then completely fail to latch the data. Because the clocks are generated by a TLL (e.g., DLL), the timing step is precise and PVT is completely compensated for. By using this arrangement, the use of separate external (expensive) functional testers is avoided. That is, a first iolb clock and a second iolb clock may be generated having a substantially precise time-lockable relationship to one another, and may be useable for substantially time-locked travel/capture of test data along at least one iolb path.

Figure 3:
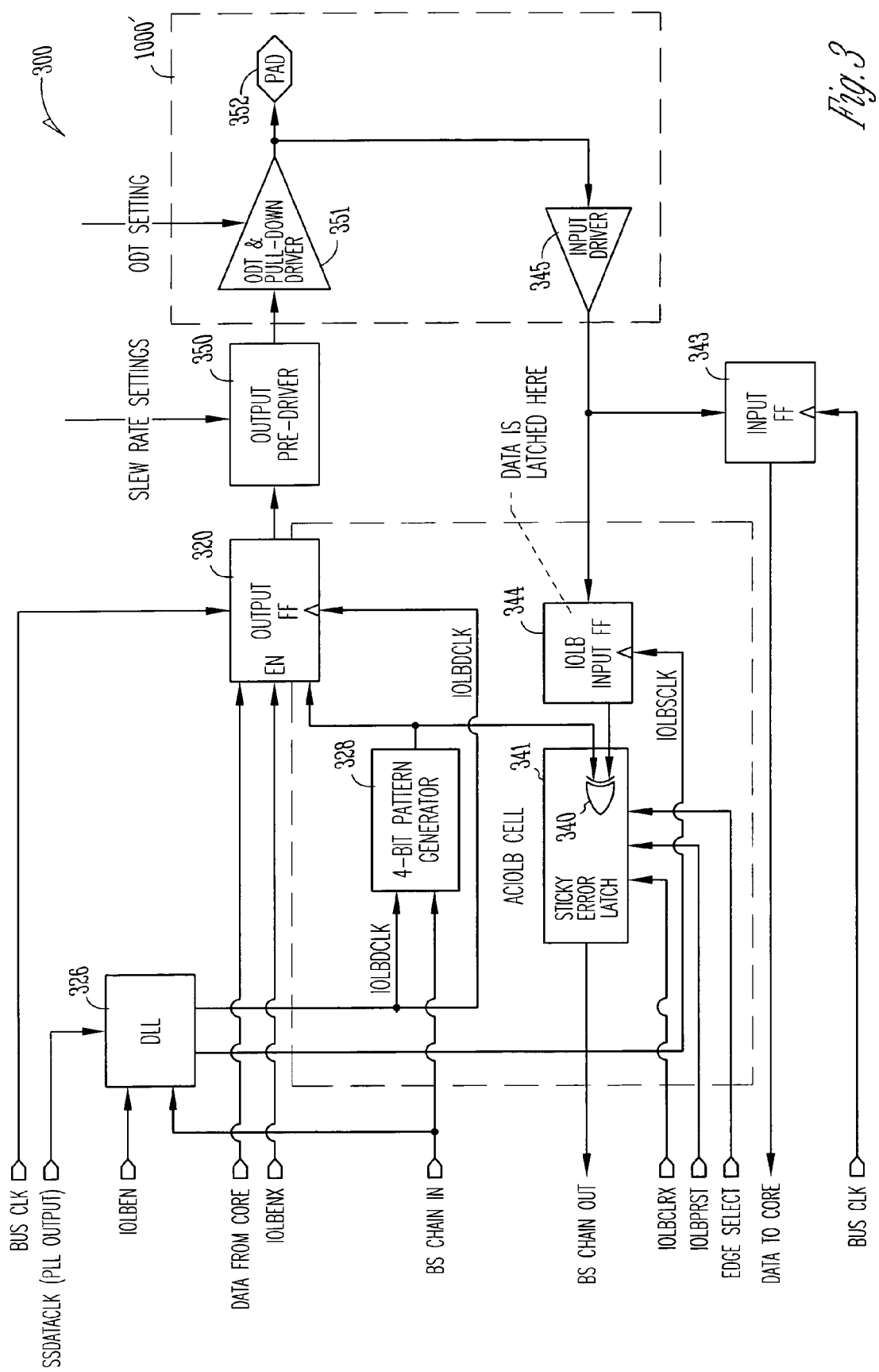
FIG. 3 is an example circuit diagram of an advantageous example (common clock) embodiment.

FIG. 3 is an example circuit diagram of an advantageous example (common clock) embodiment 300. Again for the sake of simplicity and brevity, FIG. 3 focuses only on one pad, although it should be understood that the FIG. 3 iolb circuit may be applied to all or fewer than all of the I/O pads of a device. A dash enclosed area 1000' of FIG. 3 will be of particular interest in discussions provided ahead with respect to FIG. 10+).

Within the example embodiment 300, a DLL 326 is enabled during I/O loop-back (iolb) testing using an iolb enable signal (iolben), to generate two (local) iolb clock signals during iolb testing, i.e., an I/O loop-back data clock (iolbdclk) and an I/O loop-back strobe clock (iolbsclk), derived, for example, from a system's source synchronous data clock (ssdataclk). The DLL 326 may operate according to preprogrammed settings, and/or may be able to be loaded with desired settings as indicated by the FIG. 3 notation bs chain in. Settings for the DLL 326 are dependent upon a platform upon which the present invention is implemented, and should be well within a purview of those skilled in the art.

Practice of the present invention is not limited to DLL (as was mentioned previously above), or to utilizing the system's source synchronous data clock (ssdataclk) clock. These iolbdclk and iolbsclk clocks are used during loop-back testing to trigger, for example, transitions in the data and strobe latches of the system.

Figure 7:
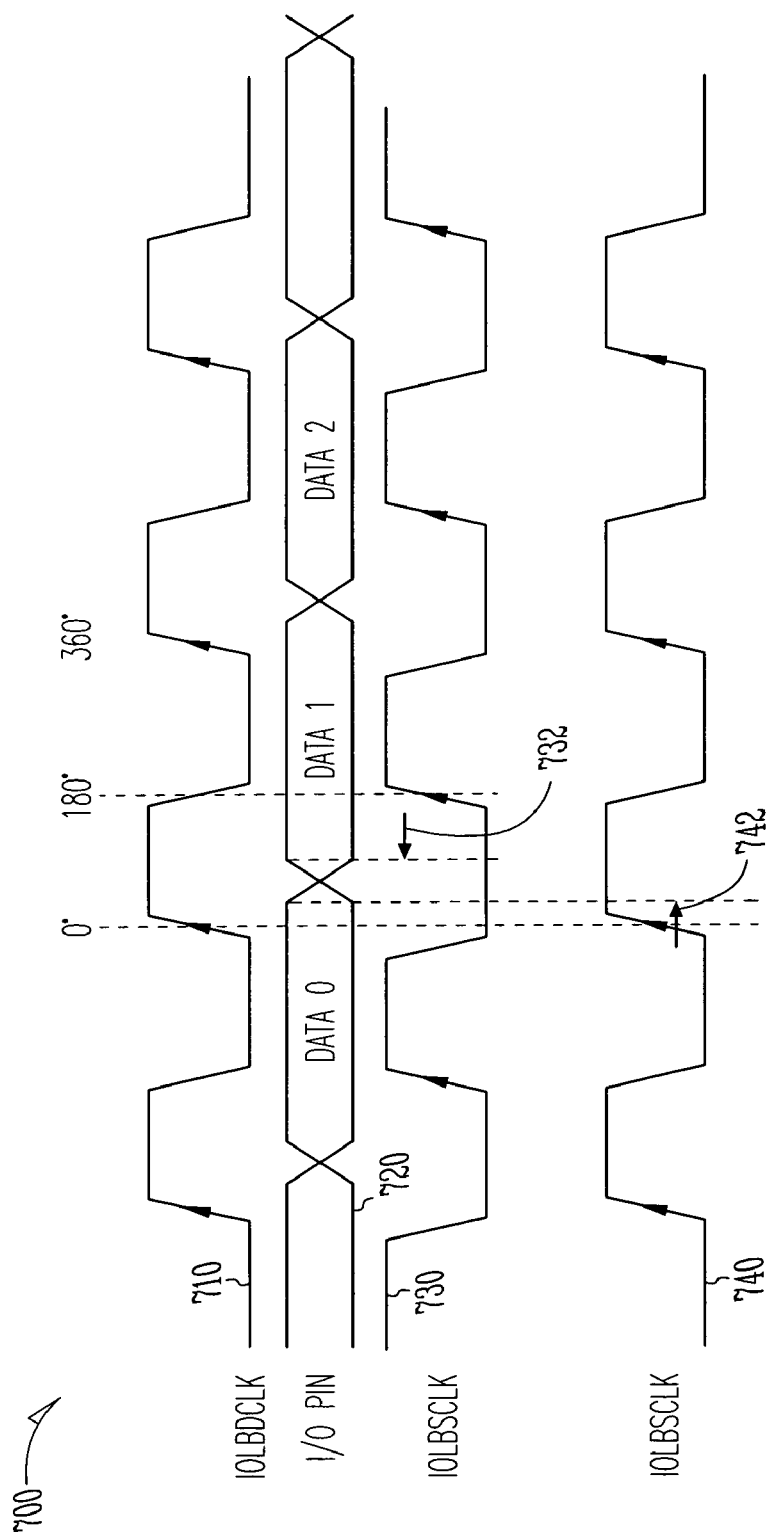
FIG. 7 is an example timing diagram useful in explanation and understanding of all-cycle and first-cycle fails during testing using the FIGS. 3–6 example embodiments.

The iolbdclk and iolbsclk clocks may be varied in relation to each other to change the strobe window. FIG. 7 simplistically illustrates a timing diagram 700 showing example strobe window variations, as well as all-cycle and first-cycle fail incidents using embodiments of the present invention. As one example of varying a strobe window, data clock iolbdclk 710 may be set to a constant zero degrees while the strobe clock iolbsclk timing can be varied between zero and 360 degrees. An example iolb I/O data is shown as data 720.

In practice, iolbsclk 730 may be initially set at 180 degrees and a test may be run to determine if the data will latch. It will normally fail at this point, as will be described later. The variation (e.g., delay) of iolbclk 730 may then be slowly decreased (shown representatively by the FIG. 7 arrow 732) by steps and additional tests run at each step until a time having a successful iolb data latching is detected. This determines the last time that all failures are detected, and thus an "all-cycle-fail" point may be detected.

As another (different) test, iolbsclk 740 may then be set to zero degrees and a test may be run which will normally be successful. The delay value of iolbsclk 740 may then be slowly increased (shown representatively by the FIG. 7 arrow 742) and additional tests run until such time as a failure is detected. This determines the first time that the failure is detected, and may be termed a "first-cycle-fail". Thus, using the above, the boundaries of the success and failure ranges may be detected.

Returning to FIG. 3, a four-bit pattern generator 328 may receive the iolbdclk signal from the DLL. Pattern generators having a different number of bits could also be used. The pattern generator 328 may operate according to preprogrammed settings, and/or may be able to be loaded with desired settings as indicated by the FIG. 3 notation bs chain in. Settings for the pattern generator 328 are dependent upon a platform upon which the present invention is implemented, and should be well within a purview of those skilled in the art. Further, the pattern generator 328 may itself generate a predetermined pattern(s), or alternatively, a predetermined pattern(s) may be loaded as indicated by the FIG. 3 notation bs chain in. An example iolb test may include one or more of the following possible test patterns, although practice of the present invention is not limited to the same: all zeros (0); all ones (1); alternating zeros and ones; a single zero; a single one; etc.

A bit from the data output pattern is sent to output flip-flop 320, and in turn (responsive to iolbdclk clocking), is transmitted to the I/O data pad 352 via a pre-driver 350 (controlled by predetermined slew rate settings) and driver 351 (controlled by ODT settings). Since the pattern generator produces a four bit signal, 16 possible patterns may be produced. Accordingly, the pattern generator 328 may service, for example, 16 different data pads which may be tested at the same time.

As to the pre-driver 350 and driver 351 located between the data flip-flop 320 and the data pad 352, such are optional and may be utilized to establish slew rate settings and other settings while driving the data signal to the pad. Differing settings may be able to be set within pre-driver 350 and driver 351 for iolb testing, as opposed to settings during normal I/O operations.

The I/O pad 352 may also be connected to input driver 345 to receive the signal as an input in a loop-back fashion. The iolb data is then received in a normal input latch 343 and iolb input latch 344. (Normal input operations with respect to the normal input latch 343 will be described further ahead.) The iolb input latch 344 is clocked by the iolbsclk signal from DLL 326. Exclusive or circuit 340 of a sticky error latch 341 determines whether the looped-back data in latch 344 corresponds to the input data from pattern generator 328. That is, the internally-known iolb data is driven through the output latches and drivers toward the pad, sampled back through input drivers and latches and compared with a copy of the same iolb data, with signal generation, travel and testing all being conducted using the iolb-DLL generated data/strobe clocks.

Initiation of comparison within the sticky error latch 341 may be triggered by a signal iolbclrx at a time when it is known that first iolb data inputs become available and stable at exclusive or gate 340, e.g., at a falling edge of a $2^{nd}$ iolbdclk signal. Operation of the sticky error latch 341 may be further controlled via an edge select signal as shown in FIG. 3. The sticky error latch 341 notes any errors and holds them (thus "sticky") for future reference, and such error data can be read out to the core for analysis as indicated by the FIG. 3 notation bs chain out. The cumulative set of errors noted determines the parameters of the I/O timing of the chip and whether the desired specifications have been met. As shown in FIG. 3, the sticky error latch 341 may be able to be preset by a signal iolbprst.

Thus, with the FIG. 3 example embodiment, existing I/O pads (together with appropriate internal iolb testing circuitry) are used to test themselves for proper functioning (e.g., component operations; path integrity) and timing.

Figure 4:
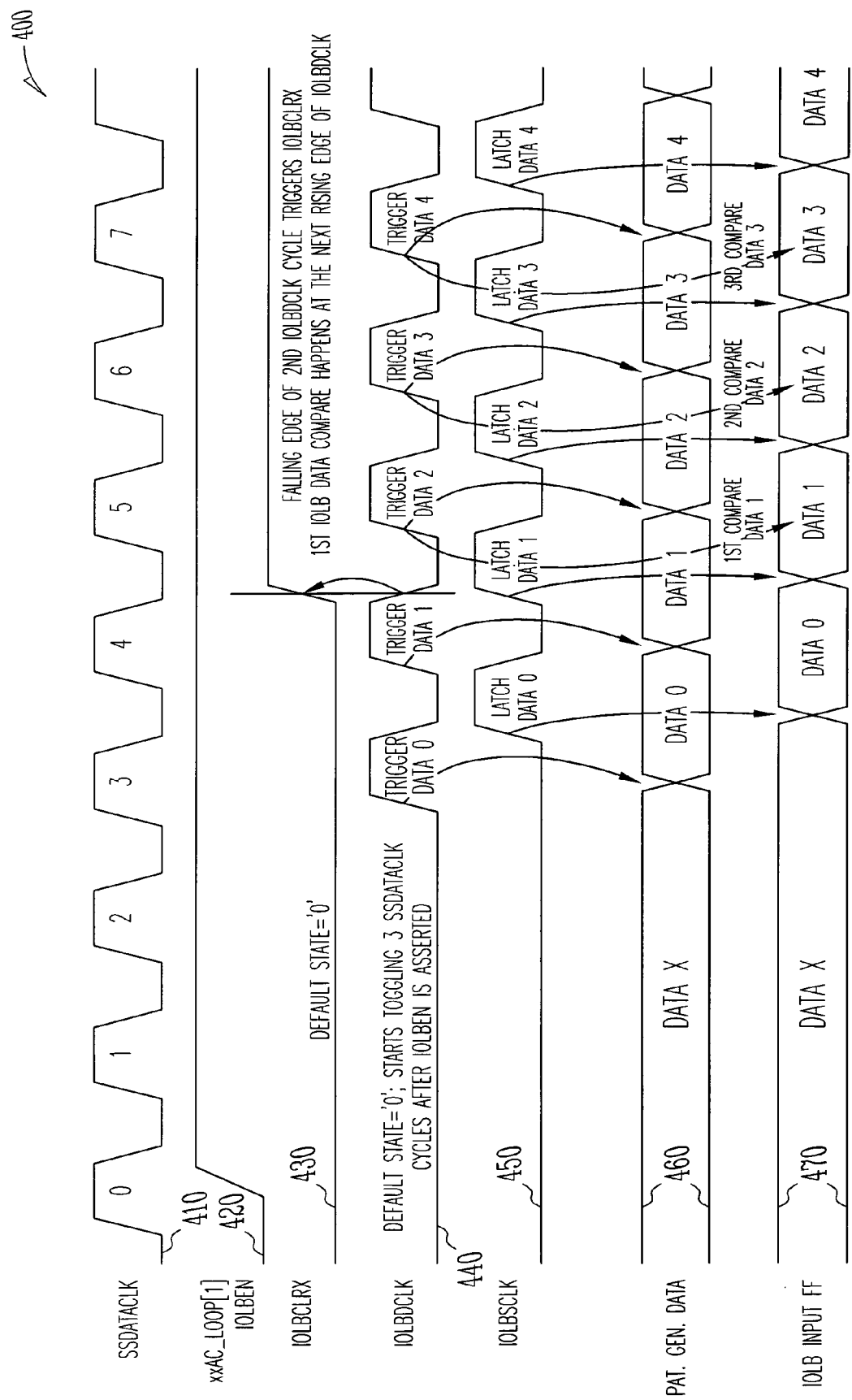
FIG. 4 is an example timing diagram of the example embodiment shown in FIG. 3.

FIG. 4 is an example timing diagram 400 of the various signals of the example embodiment shown in FIG. 3. More particularly, shown is the system's (core's) source synchronous data clock ssdataclk 410, and also ones of the iolben 420, iolbclrx 430, iolbdclk 440, iolbsclk 450, pattern generator data 460 and iolb flip-flop 470 signals in example relation to one another. Of particular interest, the phase of the iolbsclk 450 signal may be varied with respect to the iolbdclk 440, as was described previously with respect to FIG. 7. Further, the pattern generator data signal 460 may have a longer cycle than that of the clock signals. When the data signal changes, a transition area is defined. It is this transition area that is being sought by the testing. When the iolbsclk 450 signal is set at 180 degrees, the data signal is low and is not recovered in the latch. As the clock signal is reduced, the rise in iolbsclk 450 occurs earlier and eventually approaches from the right to the point at which the data level starts to rise. At this point, a first successful test will be noted and this point will be established. Then iolbsclk 450 may be set to zero degrees (in a manner similar to that previously described by signal 740 in FIG. 7) so that the data signal will be high and a test will be successful. As the strobe clock increases in value, the point on the data signal where it starts to decrease from high to low will be encountered and a first failure will be detected. Accordingly, boundaries of the transition area will then be determined.

To summarize, the above arrangement utilizes a dedicated (local iolb) PVT-independent timing loop circuitry to generate loop-back data and strobe clocks. Thus, during iolb testing, the I/O paths become decoupled from the core, enabling a loop-back operation to be entirely independent. The iolb test frequency may be set, for example, using the FIG. 3 indicated bs chain in input.

Figure 9:
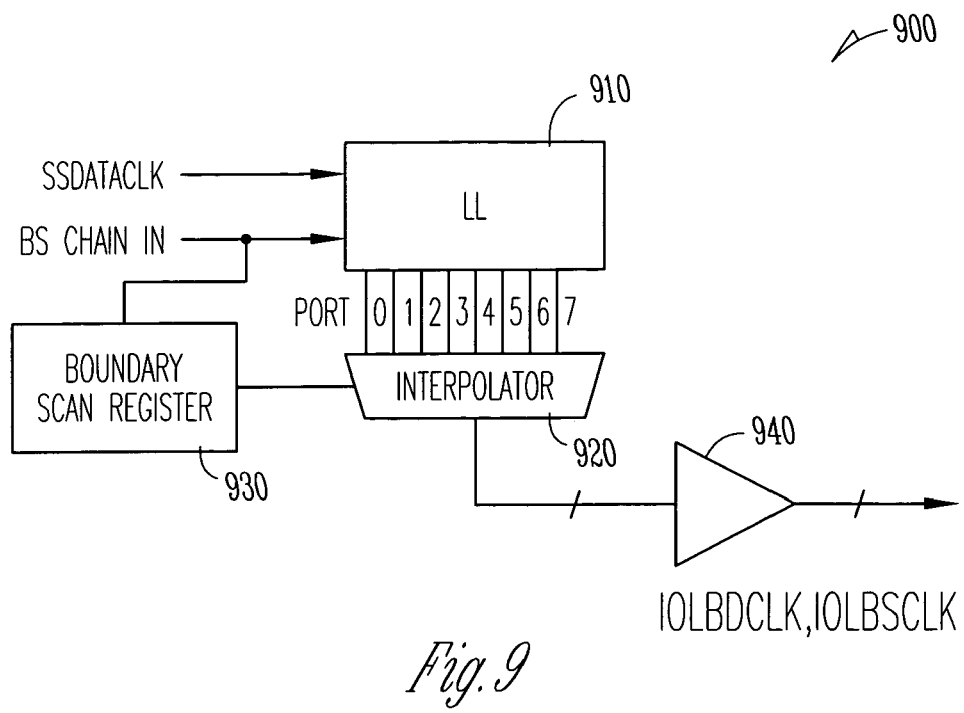
FIG. 9 is a block diagram of an example delay locked loop (DLL) arrangement useable with the FIGS. 3–6 example embodiments.

FIG. 9 illustrates an example embodiment setup 900 for the FIG. 3 DLL. More particularly, shown is a locked-loop (LL) 910 receiving both the ssdataclk and bs chain in signals, where appropriate information within the bs chain in signal may be used to set a frequency of LL 910. The LL 910 may be lowered to a package resonant frequency or increased to a higher testing frequency without affecting core paths which are running at a constant core frequency. A boundary scan register 930 also receives the bs chain in signal, where appropriate information within the bs chain in signal may be used to set boundaries thereof. An interpolator (e.g., multiplexer) 920 receives, for example, clock signals at eight (8) different timings from ports 0–7 of the LL 910, and responsive to control information from the boundary scan register 930, outputs (e.g., on separate clocking lines) the iolbdclk and iolbsclk signals through driver(s) 940.

The above arrangements facilitate testing for each edge of the data signal separately so as to completely characterize the timing distribution as a function of transition type. This also allows rise time and fall time as well as rise and fall delay to be tested and thus characterized separately. That is, first time differences between the data and clock signals may be used to test for a rising edge of one of the signals, whereas second time difference may be used to test for a falling edge of the signal.

In addition to iolb testing, the FIG. 3 embodiment also accommodates normal (non-iolb) I/O operations. That is, the DLL 326 (and thus the pattern generator 328 and iolb input flip-flop 344) is enabled on (via the iolben signal) only during an iolb testing procedure, and off during normal I/O operations and therefore does not affect normal (non-test) I/O operations of the system. Thus, the components 326, 328, 344, 340, 341 are essentially rendered inactive, and may even be constructed to be powered-down during non-iolb operations for a power-savings measure. During normal (non-iolb) operations, differing clock signals (e.g., a bus clock) may be used (alternatively to iolbdclk and/or iolbsclk) to clock ones of the components of a normal I/O path. On an output side, output flip-flop 320 may be selected via an iolb enable x signal (iolbenx) to be clocked via a bus clk, as opposed to being clocked by iolbdclk during iolb testing. Further, during normal output operations, the output flip-flop 320 would receive data from a chip core, as opposed to data from the pattern generator 328. During normal input operations, input (pad) data to the core would be inputted through the input flip-flop 343 which is clocked by the bus clk.

All of the FIG. 3 components/paths may be implemented as part of a semiconductor die, so as to facilitate self-test of such semiconductor die.

The FIGS. 3–4 common clock example embodiment works well at a lower range of clocking frequencies, e.g., up to 200 MHz. That is, at such lower range of clocking frequencies, negligible skew may exist between a phase of iolb data signal arriving at the iolb input flip-flop 344 and the iolbsck signal driving the clock input of the iolb input flip-flop 344. At higher-and-higher clocking frequencies, the skew therebetween may become less-and-less negligible. Discussion now turns to another FIGS. 5–6 example embodiment which works well at both the lower range and a higher range of clocking frequencies, e.g., at 200+MHz.

Figure 5:
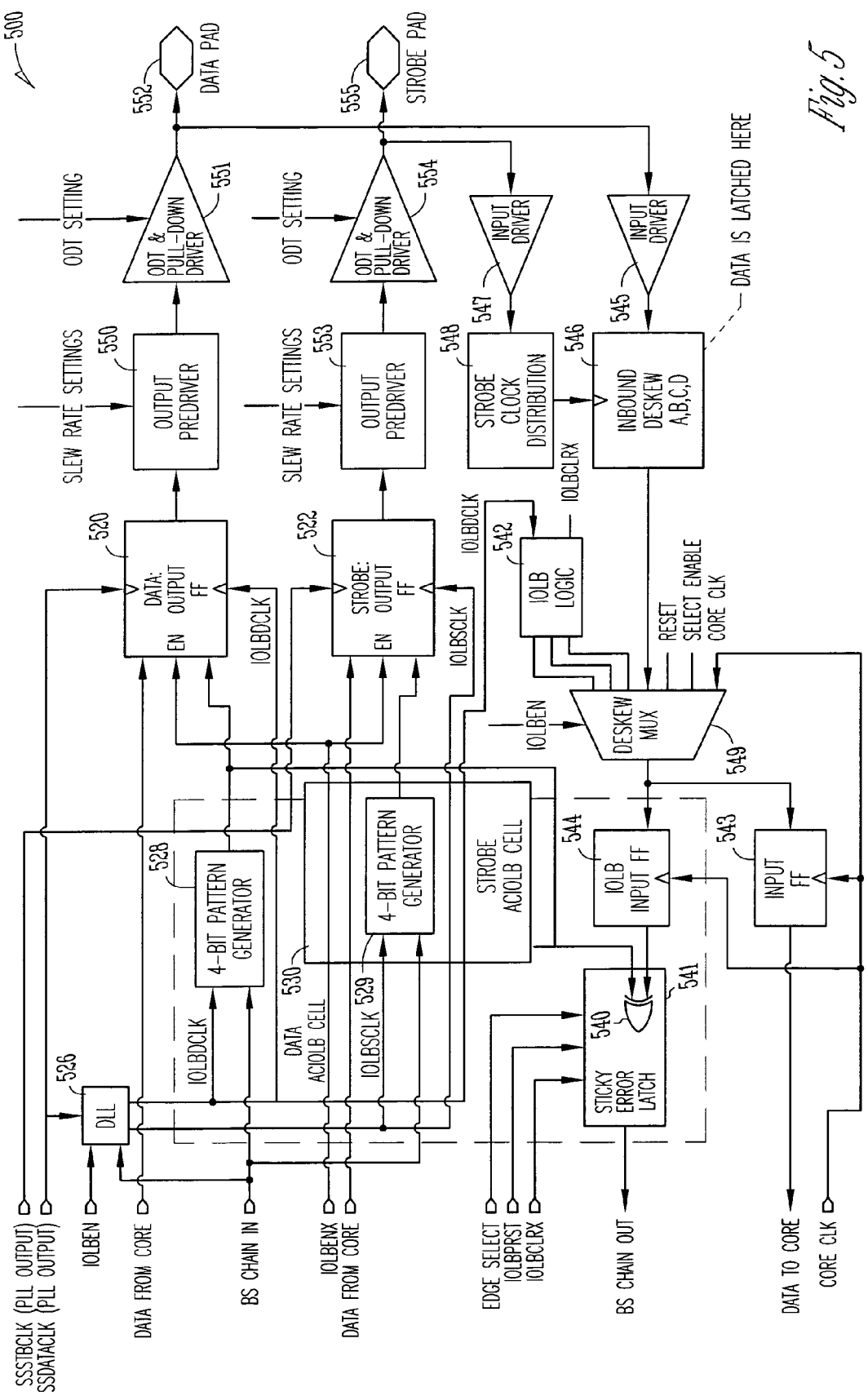
FIG. 5 is an example circuit diagram of an advantageous example (source synchronous) embodiment.
Figure 6:
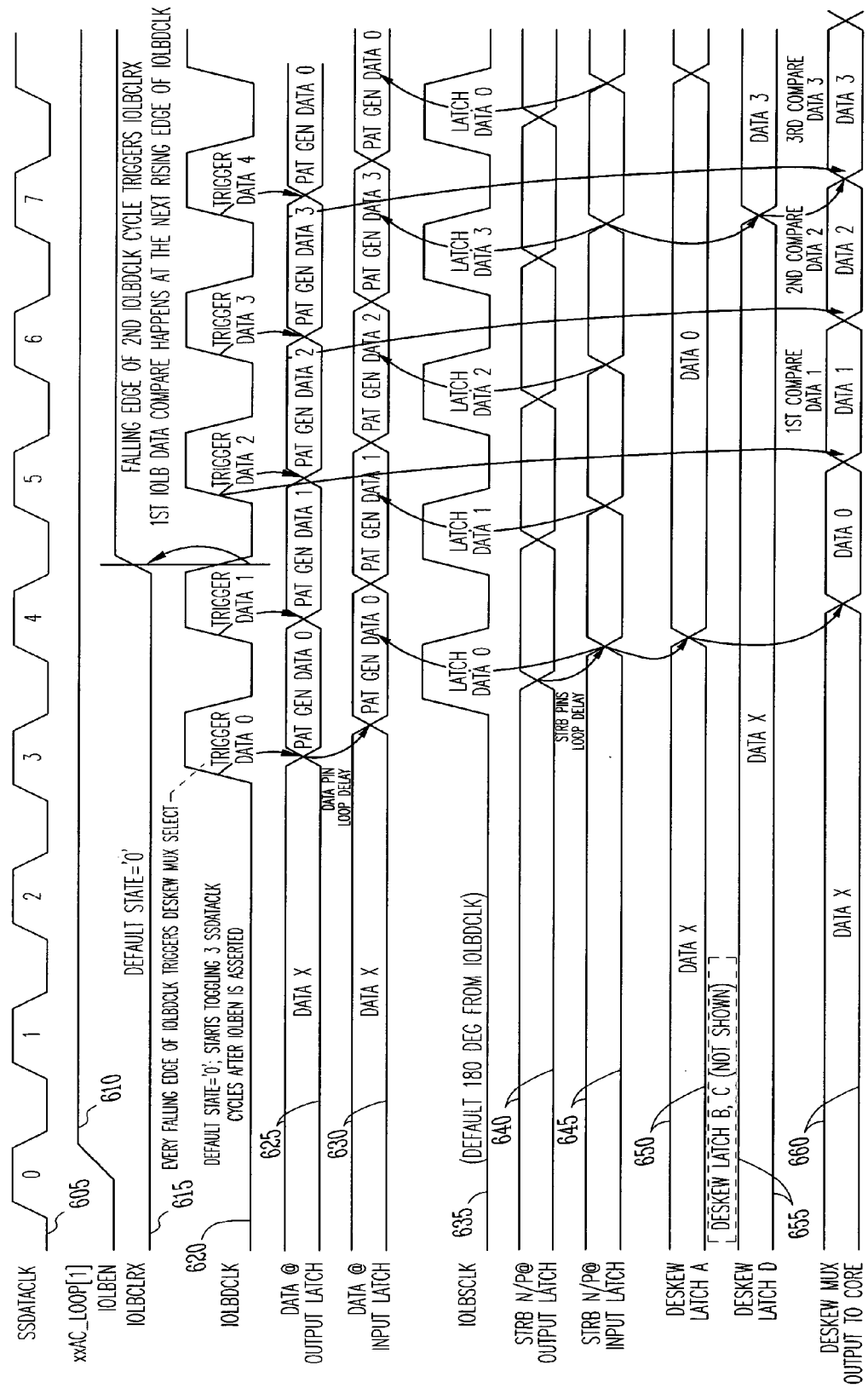
FIG. 6 is an example timing diagram of the example embodiment shown in FIG. 5.

More particularly, FIG. 5 is an example circuit diagram 500 of an advantageous source synchronous embodiment, whereas FIG. 6 is an example timing diagram of example signals existing within the FIG. 5 example embodiment. In addition to a data loop-back path (similar to that of the FIG. 3 embodiment) for the iolb operations, the FIG. 5 example embodiment further includes strobe iolb path/arrangements. As was the case with FIG. 3, again for the sake of simplicity and brevity, FIG. 5 focuses only on one set of pads, although it should be understood that the FIG. 5 iolb circuit may be applied to all or fewer than all of the I/O sets of pads of a device.

Turning first to data iolb, portions of the FIG. 5 data iolb path are similar to portions of the FIG. 3 data iolb path, so redundant discussion thereof is omitted for sake of brevity. More particularly, along a data loop-back path, the FIG. 5 DLL 526, pattern generator 528, data output flip-flop 520, output pre-driver 550, output driver 551, data pad 552, input driver 545 (with the exception of outputting to a differing inbound deskew latch 546 (discussed more ahead)), iolb input flip-flop 544 (with the exception of receiving differing inputs from a deskew multiplexer 549 (discussed more ahead) and a core clock (clk)), normal input flip-flop 543 (with the exception of receiving differing inputs from the deskew multiplexer 549 and core clock (clk)), and sticky error latch 541 (including the gate 540), are similar in construction/operation to the FIG. 3 DLL 326, pattern generator 328, data output flip-flop 320, output pre-driver 350, output driver 351, data pad 352, input driver 345, iolb input flip-flop 344, normal input flip-flop 343 and sticky error latch 341 (including the gate 340), respectively.

Discussion turns first to the FIG. 5 further strobe iolb path/arrangements. More particularly, further included is a strobe aciolb cell 530 including a (e.g., 4 bit) pattern generator 529 that receives the iolbsclk signal from the DLL. The pattern generator 529 may operate according to preprogrammed settings, and/or, may be able to be loaded with desired settings as indicated by the FIG. 5 notation bs chain in. Settings for the pattern generator 529 are dependent upon a platform upon which the present invention is implemented, and should be well within a purview of those skilled in the art. The pattern generator 529 may itself generate a predetermined pattern(s), or alternatively (like the pattern generator 528), may be loaded with a desired pattern as indicated by the FIG. 5 notation bs chain in. Again, an example iolb test may include one or more of the following possible test patterns, although practice of the present invention is not limited to the same: all zeros (0); all ones (1); alternating zeros and ones; a single zero; a single one; etc.

Although the pattern generator 529 (like the pattern generator 528) is illustrated as being, for example, a 4-bit pattern generator, a pattern generator having a different number of bits may also be used. Since the pattern generator 529 produces a four bit signal, 16 possible patterns may be produced. Accordingly, the pattern generator 529 may service 16 different strobe iolb paths/pads that may be tested at the same time. One bit of the generated strobe output pattern is sent to strobe output flip-flop 522 (similar to the data ouput flip-flop 520, but receives iolbsclk as an iolb latching signal as opposed to iolbdclk), an output pre-driver 553, output driver 554, strobe (output) pad 555 and input driver 547. A data iolb arrangement and its corresponding (mated) strobe iolb arrangement may be called a data/strobe iolb pair.

The length/arrangement of the iolb strobe path is desireably a substantially electrically equivalent to the (e.g., majority) portion of the iolb data path to which it electrically parallels, i.e., to keep the data and strobe signals in sync with each other. In order to minimize skewing between iolb data and strobe signals traveling in the respective iolb data and strobe signal paths of a given data/strobe iolb pair, the construction/operation and data path lengths of/between the pattern generator 529, strobe output flip-flop 522, output pre-driver 553, ouput driver 554, strobe (output) pad 555 and input driver 547 of the pair may be similar to those of the aforementioned data output flip-flop 520, output pre-driver 550, output driver 551, data (output) pad 552 and input driver 545 of the pair, respectively. To even further minimize skewing that may be caused by semiconductor process variations, temperature variations, voltage/current level variations, noise, etc., all components/paths for a pair may be formed at similar times during the same semiconductor manufacturing operations (so as to be formed in a same manufacturing environment), and may be provided in substantially a same area of a semiconductor die (so as to be exposed to substantially a same operating environment). Even with careful precautions, in practice, perfect matching is difficult, so some skewing may occur between data and strobe signals arriving at locations near the end of iolb strobe path.

Continuing discussions, an iolb strobe signal output of the input driver 547 is received by a strobe clock distribution 548 component, and an iolb strobe clock is then applied to a clock input of an inbound deskew 546 component. The timing position of the strobe clock determines whether the deskew latch 546 is able to capture the incoming data. Latch 546 may include four separate latches which can capture the data at four different time periods (e.g., A, B, C, D). A multiplexer 549 may select the data in each of the latches sequentially under the control of logic circuit 542 (which receives the iolbdclk and iolbclrx signals). Operations of the multiplexer 549 further may be controlled by iolben, reset and select enable inputs. Data outputted by the multiplexer 549 may be received in latches 543 and 544. In a manner similar to that which was described previously with respect to FIG. 3's components 340 and 341, the exclusive or circuit 540 of the sticky latch 541 may detect, save and output errors to the chip's core for analysis.

FIG. 6 is an example timing diagram 600 of the various signals of the example embodiment shown in FIG. 5. More particularly, shown is the system's (core's) source synchronous data clock ssdataclk 605, and also ones of the iolben 610, iolbclrx 615, iolbdclk 620, data @ output latch 625, data @ input latch 630, iolbsclk 635, strb n/p @ output latch 640, strb n/p @ input latch 645, deskew latch A 650, deskew latch D 655 and deskew mux output to core 660 signals, in example relation to one another. Operation and notes of particular interest are similar to those discussed previously with respect to the FIG. 4 timing diagram.

In addition to iolb testing, the FIG. 5 embodiment also accommodates normal (non-iolb) I/O operations. That is, the DLL 526 (and thus the pattern generator 528, pattern generator 529) is enabled on (via the iolben signal) only during an iolb testing procedure, and off during normal I/O operations and therefore does not affect normal (non-test) I/O operations of the system. Thus, the components 526, 528, 529, 544, 540 and 541 are essentially rendered inactive, and may even be constructed to be powered-down during non-iolb operations for a power-savings measure.

During normal (non-iolb) operations, differing clock signals (e.g., a system's (core's) ssdataclk and ssstbclk) may be used (alternatively to iolbdclk and/or iolbsclk) to clock ones of the components of a normal I/O path. On an output side, for example, data output flip-flop 520 can be selected via an iolb enable x signal (iolbenx) to be clocked via ssdataclk, as opposed to being clocked by iolbdclk during iolb testing. Further, during normal output operations, the output flip-flop 520 would receive data from a chip core, as opposed to data from the pattern generator 528. Likewise, strobe output flip-flop 522 can be selected via the iolb enable x signal (iolbenx) to be clocked via ssstbclk, as opposed to being clocked by iolbsclk during iolb testing. Further, the output flip-flop 520 would receive data (a strobe) from a chip core, as opposed to data from the pattern generator 529. During normal input operations, the input driver 547, strobe clock distribution block 548 and deskew block 546 would be responsive to any strobe input applied to the strobe pad 555. Further, the iolb logic 542 and deskew multiplexer 549 would be set so as to pass incoming data to the input flip-flop 543, as clocked by the core clk.

Figure 8:
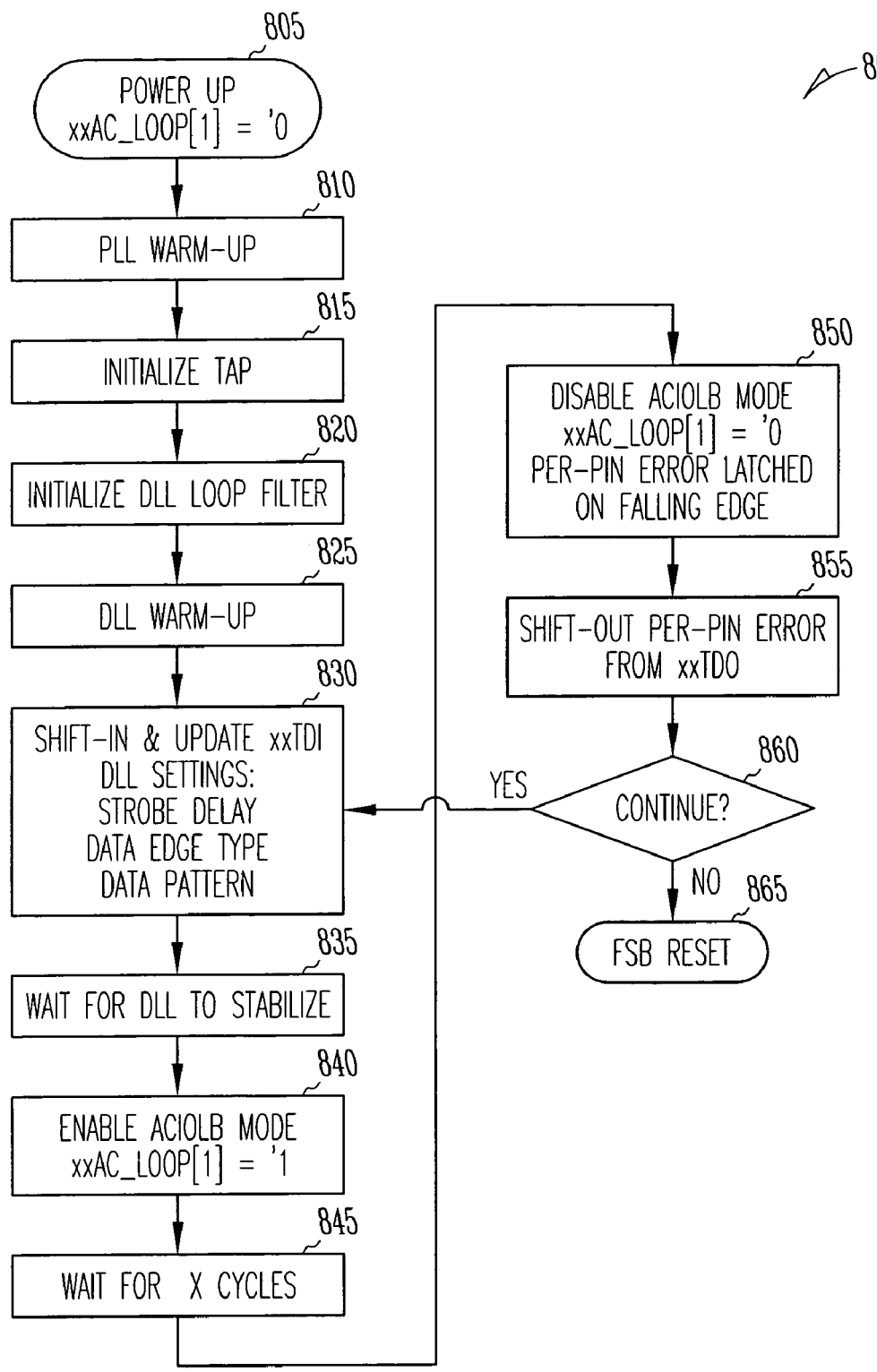
FIG. 8 is an example flow diagram of example operations useable with the FIGS. 3–6 example embodiments.

FIG. 8 is an example flow diagram 800 of example operations useable with the FIGS. 3–6 example embodiments. At block 805, power up is conducted, and a loop count is set to zero (0). In block 810, the system's (core's) PLL is warmed up, e.g., for a predetermined time. In block 815, a TAP initialization is conducted. Next, in block 820, the local (i.e., iolb) DLL loop filter is initialized, and in block 825, the DLL is warmed up, e.g., for a predetermined time. In block 830, there is a shift in and/or updating of test data in (TDI) information, e.g., DLL settings such as a desired strobe delay, a data edge type, data pattern, etc.; data generator settings; etc. Again, possible types of settings as well as the value of such settings are dependent upon a platform upon which the present invention is implemented, and should be well within a purview of those skilled in the art. In block 835, waiting is conducted (e.g., for a predetermined time) to allow the DLL to stabilize. In block 840, an iolb mode is enabled, and a loop count is set to one (1). In block 845, an iolb test is conducted for a predetermined amount of time, e.g., x cycles. In block 850, the iolb mode is disabled, the loop count is reset back to zero (0), and per-pin error is latched on a clock falling edge. In block 855, per-pin error is shifted out, e.g., to the chip's core or an external analyzer for error analysis. In decision block 860, a determination is made as to whether additional iolb testing is to be conducted. If yes, operations of the blocks 830 through 855 are again conducted. If no, iolb testing is finished and appropriate items reset, e.g., iolb components deactivated.

With helpful background having been given, discussion turns now to specific example embodiments of the present invention. That is, embodiments of the present invention provide improved arrangements for on-die self-measurement of (dc) I/O specifications (in addition to iolb clocking/timing and testing). More particularly, FIG. 10+ will now be used in descriptions tending toward disclosure of example ones of the improved arrangements.

While the discussions will focus on example embodiments applicable within the FIG. 3 common clock embodiment, practice of embodiments of the present invention is not limited thereto. For example, embodiments of the present invention may, with suitable additions/adjustment, be able to be practiced with the FIG. 5 source synchronous embodiment. Further, common-clock and/or source-synchronous timings may also be implemented in use with embodiments of the present invention. Such additions/adjustment should be well within the purview of ones skilled in the art.

In beginning the discussions, it is useful to first detail a disadvantageous circuit portion. More particularly, FIG. 3 illustrates a dash-enclosed output loop potion 1000' which is of particular interest to the present discussions. Such portion 1000' may be alternatively represented by the output loop portion 1000 shown in FIG. 10.

Figure 10:
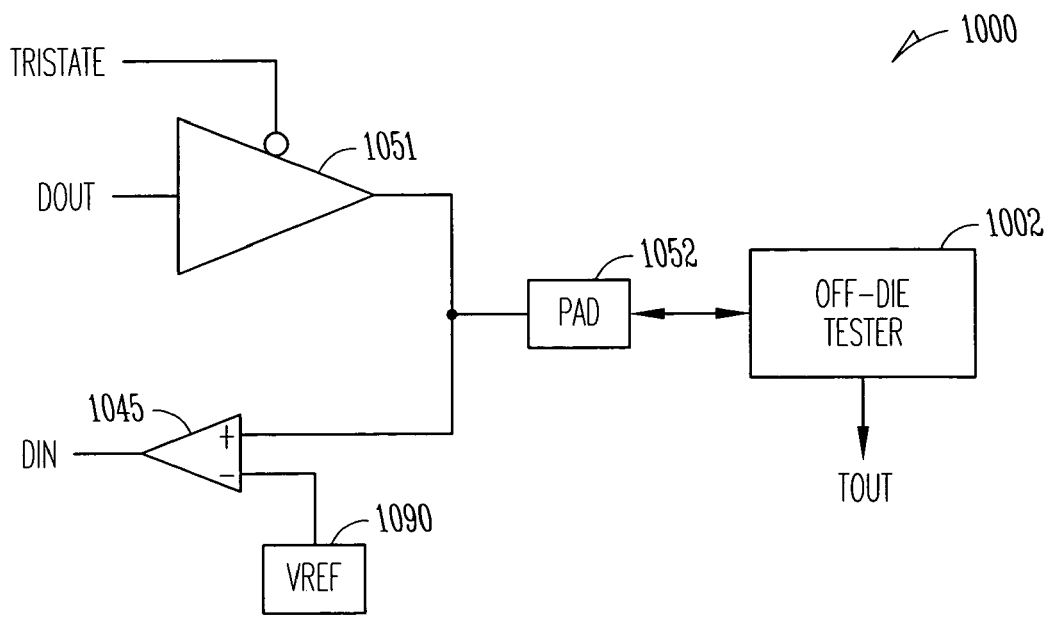
FIG. 10 is an example background iolb arrangement useful in gaining a more thorough understanding of the present invention.

That is, the FIG. 10 output loop portion 1000 may include a tristateable output buffer/driver 1051 (which may be, for example, a Gunning transceiver logic (GTL) output buffer) connected to receive a data output DOUT and provide an output to a pad 1052. The pad 1052 may, which, in turn, be loop-back connected to one input of an input buffer/driver 1045 (which may, for example, be a Gunning transceiver logic (GTL) input buffer). Another input of the input buffer/driver 1045 may be connected to receive a voltage reference level from a voltage reference arrangement VREF 1090, and an output of the input buffer/driver 1045 supplies input data on a line DIN.

The FIG. 10 output loop portion further includes a connection of the pad 1052 with an off-die (external) tester 1002. As with the prior FIGS., FIGS. 10–13 (and FIGS. 15–17 described ahead) focus only on one pad (for simplicity/brevity). Again, it should be understood that the arrangements of such FIGS may be equally/separately applicable to testing for all or fewer than all of the I/O pads of a device.

As non-limiting examples of (dc) I/O buffer specifications that may be of testing interest, the input trip point, output drive-level and pin leakage are important I/O buffer specifications that need to be validated for correct I/O buffer functionality. While example arrangements/embodiments will be used to describe the examples of input trip point, output drive-level and connection (e.g., pin, pad) leakage, practice of the present invention is by no means limited to arrangements for such example specification testing.

Figure 11:
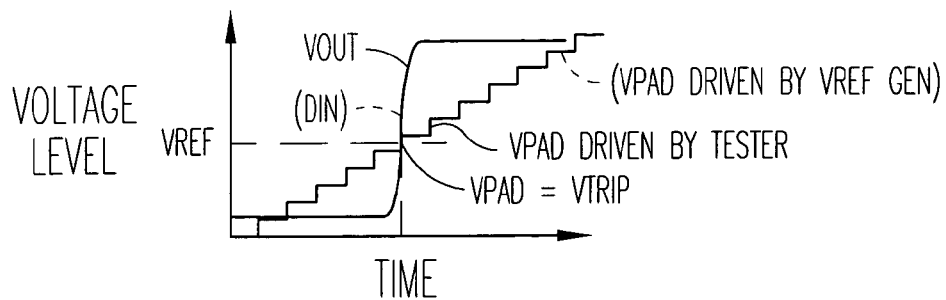
FIGS. 11–13 are example waveform diagrams useful in gaining a more thorough understanding of example I/O specification testings.

Discussion turns first to FIGS. 10 and 11 which will used to describe a disadvantageous input trip point testing arrangement disadvantageously using the off-die (external) tester 1002. Input trip point is defined as the pad value where input buffer's output (on FIG. 10's DIN line) flips between low and high states. To conduct the input trip point testing, a voltage reference level (shown illustratively by FIG. 11's horizontal "Vref" waveform) from voltage reference arrangement VREF 1090 is applied to input buffer/driver 1045. Further, the FIG. 10 output buffer/driver 1051 is tri-stated so as to isolate the pad 1052 therefrom. Such allows the off-die tester 1002 to drive voltage levels onto the pad 1052.

The off-die tester then begins to drive stepped voltage levels (shown illustratively by FIG. 11's stepped "Vpad driven by tester" waveform) onto the pad 1052. The input buffer/driver 1045 will compare these voltage levels. The off-die tester 1002 may be further connected (e.g., via a differing pad) to monitor a voltage level of FIG. 10's DIN line. Initially, a voltage level of the stepped Vpad waveform will be below the Vref voltage level, and thus the input buffer/driver 1045 will output a low voltage level (shown illustratively by FIG. 11's lower "Vout" horizontal waveform portion) on the DIN line. At a point in time where the Vpad's stepped voltage level substantially matches the Vref voltage level, the input buffer/driver 1045's output (on FIG. 10's DIN line) flips between low and high states (shown illustratively by FIG. 11's substantially vertical "Vout" waveform portion), and thereafter, remains high (shown illustratively by FIG. 11's upper "Vout" horizontal waveform portion) on the DIN line.

The off-die tester 1002 may output test data (shown illustratively by FIG. 10's TOUT arrow) once the above test has been completed, such test data containing information being indicative of a pass/fail of the circuit and/or IC, or containing information which can be used for determination of a pass/fail of the circuit and/or IC.

As mentioned previously within the Background section, significant problems with use of an off-die (external) tester are that the tester equipment may represent an enormous hardware expense, and the tester (designed/built with past generation (slower) ICs) may be ill equipped to test next generation (faster) ICs. Further, the need to connect/disconnect the circuit/IC from the off-die tester 1002 represents further financial/man-power expense, and once the die is separated (post-testing) from the external tester 1002, the external tester 1002's output test data must thereafter somehow be related to the specific die which had been tested. Such represents a cross-referencing overhead that increases testing/manufacturing costs. As an additional disadvantage, use of the off-die tester 1002 (maintained at a manufacturing facility) offers no ability for real-time circuit/IC testing of an IC while such IC is implemented in the field.

Figure 14:
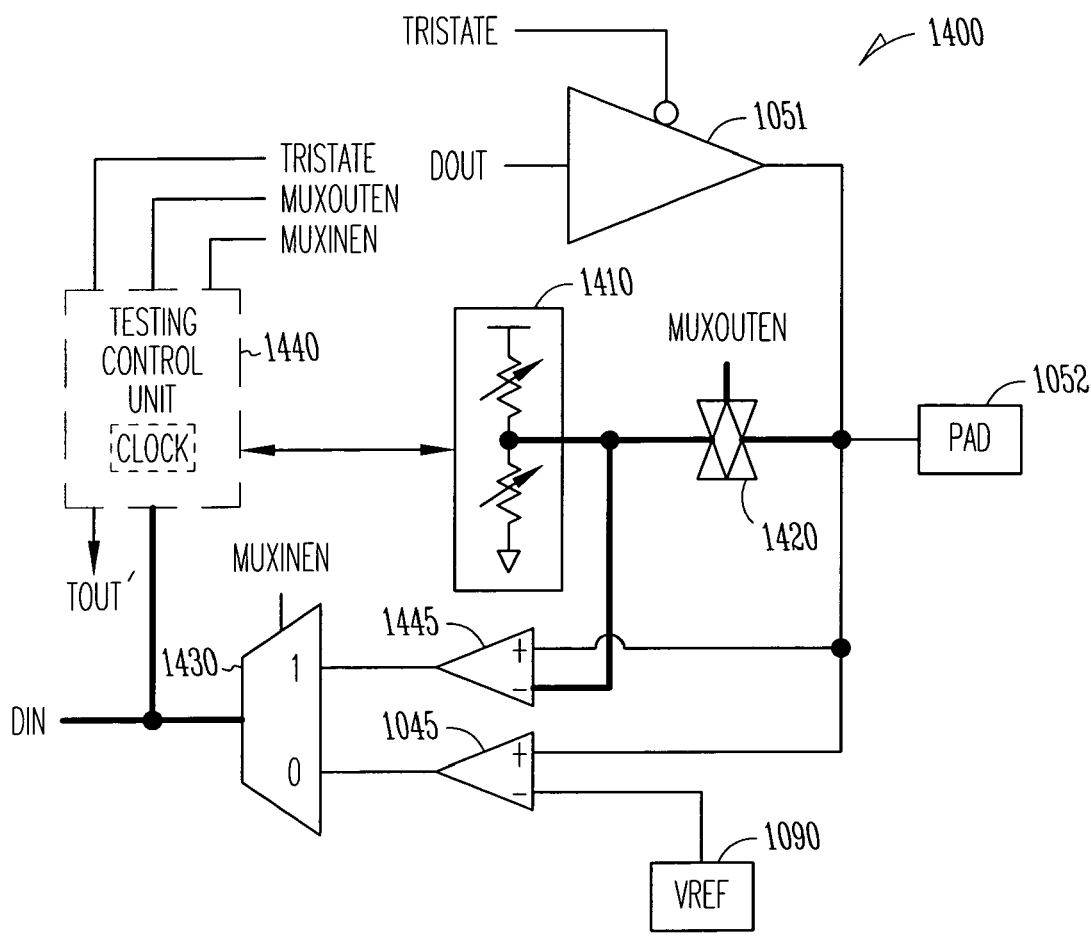
FIG. 14 is an example circuit diagram of an advantageous example self-test iolb embodiment of the present invention, such circuit being capable of testing various example I/O specifications.

Hence, attention now turns to FIG. 14 which shows an example generic advantageous output loop (I/O specification testing) portion 1400 embodiment of the present invention. The FIG. 14 circuit is generic in the sense that it can be used to perform (on-die) self-measurement testing of a number of (dc) I/O specifications (e.g., input trip point, output drive-level and pin leakage I/O buffer specifications). All of the FIG. 14 components/paths may be implemented as part of a semiconductor die, so as to facilitate self-test of such semiconductor die.

Portions of FIG. 14 that are similar and/or redundant with the FIG. 10 circuit are not described again for sake of simplicity/brevity. Further, again for the sake of simplicity and brevity, FIG. 14 focuses only on one pad, although it should be understood that the FIG. 14 circuit may be applied to all or fewer than all of the I/O pads of a device.

Some of the additional arrangements within FIG. 14 may be shown in bolded (highlighted) form for the reader's ease in differentiating additions over the FIG. 10 circuit. When the FIG. 14 embodiment is implemented, for example, within the previously described FIG. 3 embodiment, some of the FIG. 3 parts/lines may be able to be used in a double-duty fashion to serve as part/lines of the FIG. 14 embodiment.

Additional arrangements As additional arrangements, the FIG. 14 output loop portion 1400 may include a (e.g., full-range from 0 volts all the way to Vcc) Vref generator 1410 having an output connected to a pass gate 1420 (selectable to pass or not pass with an example signal MUXOUTEN), with the other side of the pass gate 1420 being connected to the pad 1052.

The FIG. 14 circuit may further include an additional self test loop back (stlb) portion including connection of the Vref generator 1410 output with an input buffer/driver 1445 (complementary to the original input buffer/driver 1045) and a multiplexer 1430. As one example, the input buffer/driver 1445 as a self-test implementation buffer/driver, may be a wide range common mode (CM) type of input buffer/driver. A wide common-mode input buffer is used because in measuring a pad output drive value, the output drive may be either close to the supply rail or close to the ground which may not be able to be sensed by limited dynamic range of the GTL input buffer.

Another buffer/driver 1445 input is connected to the pad 1052, while the output of the buffer/driver 1445 is connected to one input of the multiplexer 1430. Another multiplexer 1430 input is connected to receive the output from the normal input buffer/driver 1045 (the term normal is used in the sense that the input buffer/driver 1045 is normally used in non-test I/O operations), and an output of the multiplexer 1430 is connected to the line DIN. The multiplexer is selectable with an example signal MUXINEN.

Further, somewhere on-die, there may be provided a testing control unit 1440 that may be hard-wired and/or programmed to control operation of the FIG. 14 circuit. Such testing control unit 1440 may provide the aforementioned TRISTATE, MUXOUTEN and MUXINEN signals, and may also control settings/operation of the Vref generator 1410. Further, during self-measurement I/O characteristic testing, such testing control unit 1440 may monitor any ones of a clock, an output on the DIN line, and information from the Vref generator 1410 (e.g., a real-time Vref voltage level being output by the Vref generator 1410).

The testing control unit 1440 may output test data (shown illustratively by FIG. 14's TOUT arrow) once the above test has been completed, such test data containing information being indicative of a pass/fail of the circuit and/or IC, or containing information which can be used for determination of a pass/fail of the circuit and/or IC. At least a majority of the testing control unit 1440 and operations thereof may be able to be provided by one or more on-die processors, e.g., through suitable wiring and/or programming.

If the testing control circuit is not provided on-die, it may alternately be provided off-die, e.g., as part of a structural or functional tester.

The Vref generator 1410, pass gate 1420, input buffer/driver 1445 and testing control unit 1440 may be able to be constructed so as to be selectably enabled on only during an iolb self-testing procedure, and off during normal I/O operations, so as not to affect normal (non-test) I/O operations of the system. Thus, such components are essentially rendered inactive during non-testing, and may even be constructed to be powered-down during non-testing operations for a power-savings measure.

Figure 15:
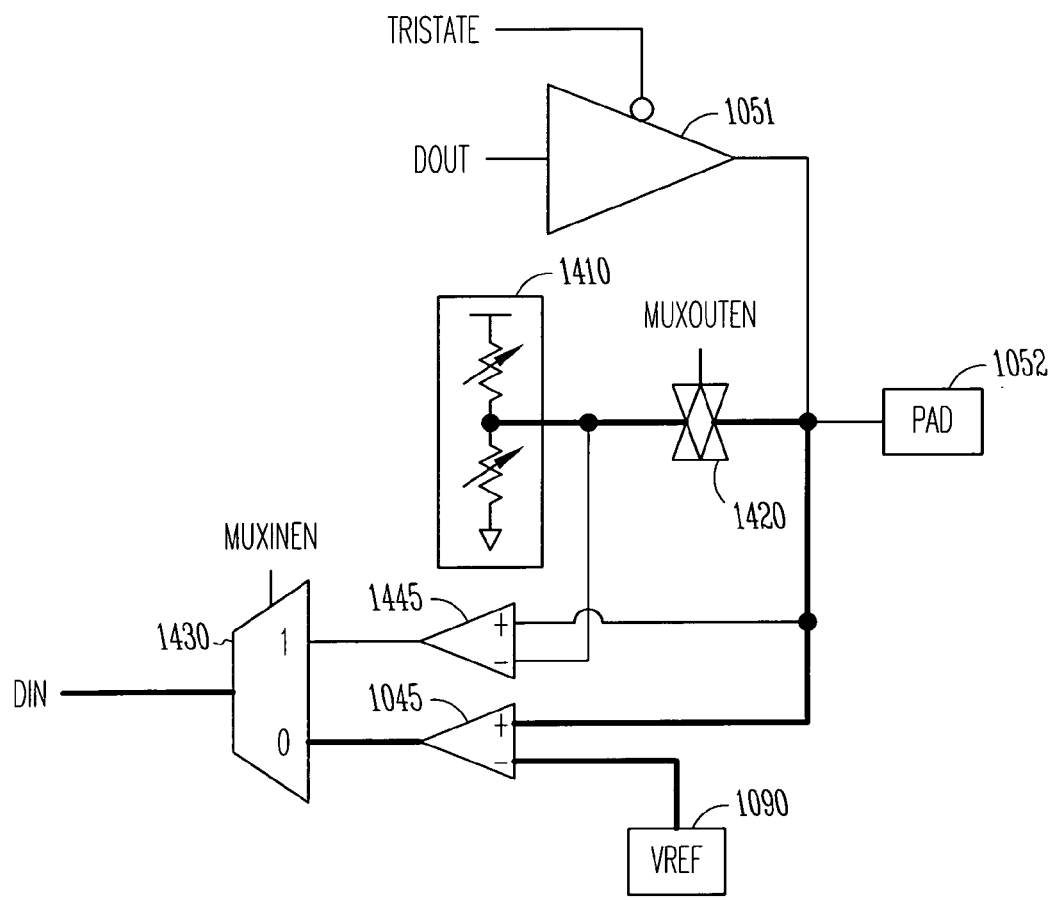
FIGS. 15–17 are circuit diagrams simplified from FIG. 14, and are useful in gaining a more thorough understanding of how the example FIG. 14 circuit may be used to test various example I/O specification.

FIG. 15 (and the signals enclosed within parenthesis within FIG. 11) will now be used to describe how the FIG. 14 on-die generic output loop (I/O specification testing) circuit can be used to perform input trip point testing without the need for the off-die (external) tester 1002. The testing control unit 1440 (and associated lines/signals) is not shown in FIG. 15 in order to simplify such circuit. Within the simplified circuit, ones of the FIG. 15 components/paths used in input trip point testing may be shown in bolded (highlighted) form for the reader's ease in differentiating such components/paths.

For input trip point testing, the voltage reference level (shown illustratively by FIG. 11's horizontal "Vref" waveform) from voltage reference arrangement VREF 1090 is applied to input buffer/driver 1045. The FIG. 15 output buffer/driver 1051 is tri-stated via an appropriate TRISTATE signal so as to isolate the same from the pad 1052, the pass gate 1420 is enabled (via an appropriate MUXOUTEN signal) to pass signals therethrough, and the mulitplexer is selected to pass the output from the input buffer/driver 1045 to the DIN line. In contrast to the FIG. 10 off-die tester 1002 driving voltage levels, the FIG. 15 on-die Vref generator 1410 now drives voltage levels onto the pad 1052 (shown illustratively in FIG. 11 by the stepped "Vpad driven by Vref Gen" waveform"). In input trip-point characterization, the full-range Vref generator 1410 drives programmed voltage levels to the pad.

That is, the on-die Vref generator 1410 is programmed and/or selected on to begin to drive stepped voltage levels onto the pad 1052. The input buffer/driver 1045 will compare these voltage levels. The on-die testing control unit 1440 (not shown in FIG. 15 for simplicity) may monitor a voltage level of FIG. 15's DIN line. Initially, a voltage level of the stepped Vpad waveform will be below the Vref voltage level, and thus the input buffer/driver 1045 will output a low voltage level (shown illustratively by FIG. 11's lower "DIN" horizontal waveform portion).

The stepped voltage level is increased or decreased until the input buffer/driver 1045 trips. At a point in time where the Vpad's stepped voltage level substantially matches the Vref voltage level, the input buffer/driver 1045's output (on FIG. 15's DIN line) flips between low and high states (shown illustratively by FIG. 11's substantially vertical "DIN" waveform portion), and thereafter, remains high (shown illustratively by FIG. 11's upper "DIN" horizontal waveform portion). The Vref Generator 1410's voltage level (i.e., step) at which the output flips, represents the self-measured input buffer trip point voltage level characteristic.

The on-die testing control unit 1440 may store and/or output test data (shown illustratively by FIG. 14's TOUT' arrow) once the above test has been completed, such test data containing information being indicative of a pass/fail of the circuit and/or IC (e.g., after referencing an on-die stored look-up table), or containing information (such as the self-measured input buffer trip point voltage level) which can be used for determination of a pass/fail of the circuit and/or IC. Such TOUT' test data may be provided to and analyzed by the IC's on-die processors (e.g., via a memory look-up table), or alternatively, may be passed off-die for analysis.

Figure 12:
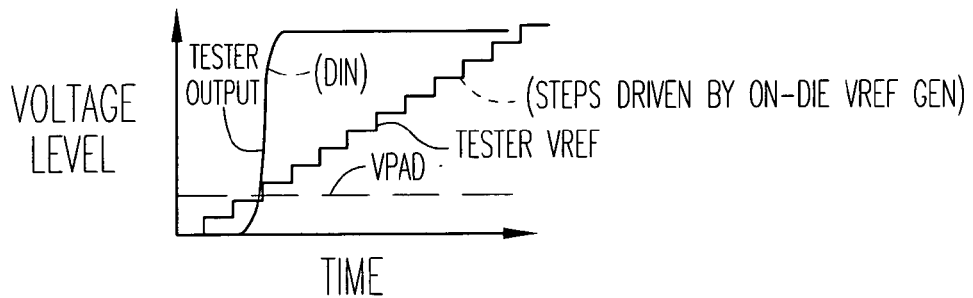

Discussion turns next to FIGS. 10 and 12 which will used to describe a disadvantageous output drive-level testing arrangement disadvantageously using the off-die (external) tester 1002. Output drive-level is defined as a high and low value that is driven onto the output pad by the die's on-die output driver. It may be measured by changing (e.g., stepping) the off-die tester 1002 reference voltage level until the off-die tester 1002 samples and detects a logic high or low pad level.

To conduct output drive-level testing, the FIG. 10 output buffer/driver 1051 is locked on so as to drive a high or low voltage level onto the pad 1052. Such driven pad voltage level is inputted into the off-die tester 1002 (and is shown illustratively by the FIG. 12 "Vpad" horizontal waveform). The off-die tester 1002 then begins to internally compare an inputted pad voltage level to internal stepped voltage levels (shown illustratively by FIG. 12's stepped "Tester Vref" waveform). Initially, a voltage level of the stepped Tester Vref waveform will be below the Vpad voltage level, and thus a tester (comparison) output will be at a low voltage level (shown illustratively by FIG. 12's lower "Tester Output" horizontal waveform portion). At a point in time where the Tester Vref's stepped voltage level substantially matches the driven Vpad voltage level, tester (comparison) output flips between low and high states (shown illustratively by FIG. 12's substantially vertical "Tester Output" waveform portion), and thereafter, remains high (shown illustratively by FIG. 12's upper "Tester Output" horizontal waveform portion).

Again, the off-die tester 1002 may output test data (shown illustratively by FIG. 10's TOUT arrow) once the above test has been completed, such test data containing information being indicative of a pass/fail of the circuit and/or IC, or containing information which can be used for determination of a pass/fail of the circuit and/or IC.

Figure 16:
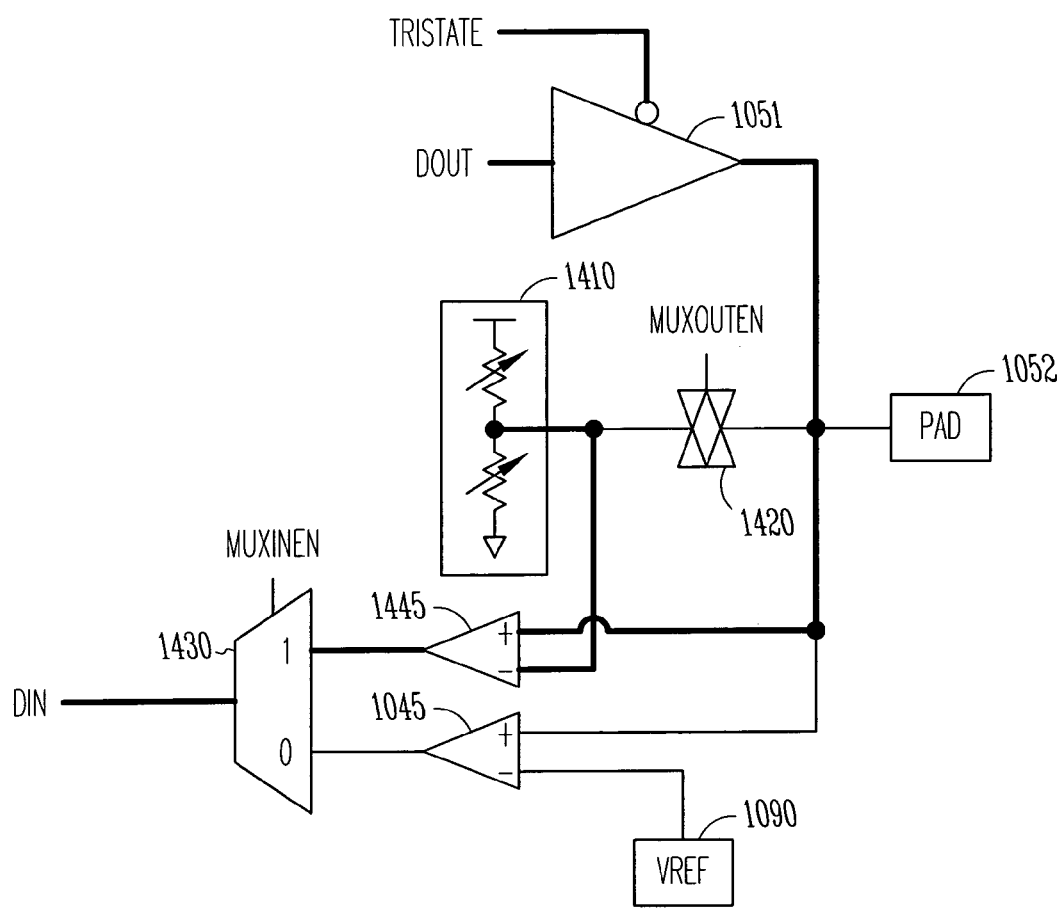

FIG. 16 (and the signals enclosed within parenthesis within FIG. 12) will now be used to describe how the FIG. 14 on-die generic output loop (I/O specification testing) circuit can be used to perform output drive-level testing without the need for the off-die (external) tester 1002. The testing control unit 1440 (and associated lines/signals) is again not shown in FIG. 16 in order to simplify such circuit. Within the simplified circuit, ones of the FIG. 16 components/paths used in input trip point testing may be shown in bolded (highlighted) form for the reader's ease in differentiating such components/paths.

For output drive-level testing, the pass gate 1420 is disabled (via an appropriate MUXOUTEN signal) to block signals from passing therethrough, and the mulitplexer is selected to pass the output from the input buffer/driver 1445 to the DIN line. The FIG. 16 output buffer/driver 1051 is locked on so as to drive a high or low voltage level toward the pad 1052 (shown illustratively by FIG. 12's "Vpad" horizontal waveform). Such driven pad voltage level is inputted into one input of the input buffer/driver 1445. For output drive characterization, the wide common-mode input buffer 1445 is used because the pad value may be either close to the supply rail or close to ground which may not be able to be sensed by limited dynamic range of the normal (GTL) input buffer 1045.

The on-die Vref generator 1410 is programmed and/or selected on to begin to drive stepped voltage levels (shown illustratively by FIG. 12's "Steps Driven By On-Die Vref Gen" waveform) into the other input of the input buffer/driver 1445. The on-die input buffer/driver 1445 then begins to compare the driven pad voltage level to the Vref Generator 1410's stepped voltage levels, and passes a comparison result through the multiplexer 1430 and onto the DIN line. The on-die testing control unit 1440 (not shown in FIG. 16 for simplicity) may monitor a voltage level of FIG. 16's DIN line.

Initially, a voltage level of the stepped Tester Vref waveform will be below the Vpad voltage level, and thus a tester (comparison) output will be at a low voltage level (shown illustratively by FIG. 12's lower "DIN" horizontal waveform portion). At a point in time where the Vref Generator 1410's stepped voltage level substantially matches the driven Vpad voltage level, an (comparison) output flips between low and high states (shown illustratively by FIG. 12's substantially vertical "DIN" waveform portion), and thereafter, remains high (shown illustratively by FIG. 12's upper "DIN" horizontal waveform portion). The Vref Generator 1410's voltage level (i.e., step) at which the output flips represents the self-measured output drive-level characteristic.

The on-die testing control unit 1440 may store and/or output test data (shown illustratively by FIG. 14's TOUT' arrow) once the above test has been completed, such test data containing information being indicative of a pass/fail of the circuit and/or IC (e.g., after referencing an on-die stored look-up table), or containing information (such as the self-measured output drive-level) which can be used for determination of a pass/fail of the circuit and/or IC. Such TOUT' test data may be provided to and analyzed by the IC's on-die processors (e.g., via a memory look-up table), or alternatively, may be passed off-die for analysis.

A few viable variations are noted with respect to the FIG. 16 embodiment. More particularly, it is noted that one of the pattern generators described previously with respect to the FIGS. 1–9 embodiments may be used to apply differing patterns to FIG. 16's DOUT input, so as to vary an output drive level such that a output drive profile may be developed with respect to differing output drive levels. That is, the pattern generator may be used, for example, to effect a 0.2V output drive level and output drive level testing conducted, then used to effect a 0.3V output drive level and output drive level testing conducted, etc.

Figure 13:
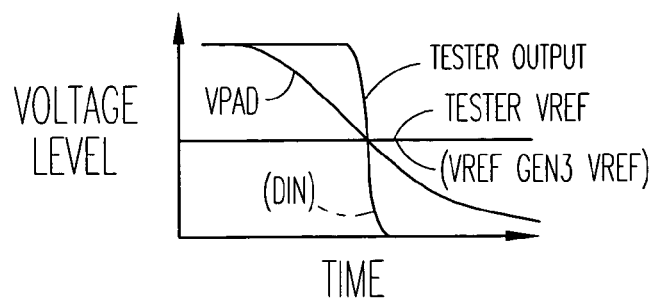

Discussion turns next to FIGS. 10 and 13 which will used to describe a disadvantageous connection (e.g., pin, pad) leakage testing arrangement disadvantageously using the off-die (external) tester 1002. Connection leakage is defined as an amount of charge that the connection (e.g., pin, pad) loses (leaks) for a given period of time. It may be measured by first driving a charge onto the pin (or pad), isolating the pin, and then detecting charge or voltage levels at a single or periodic times. The example embodiment will be describe using an example pad leakage.

To conduct pad leakage testing, the FIG. 10 output buffer/driver 1051 is momentarily turned on so as to drive a high voltage level onto the pad 1052. Such driven pad voltage level is inputted into the off-die tester 1002 (shown illustratively by FIG. 13's upper horizontal portion of the "Vpad" waveform), and a voltage reference (e.g., equivalent to half the level of the pad's high voltage level) is set up (shown illustratively by FIG. 13's horizontal "Tester Vref" waveform) within the off-die tester 1002. Any leakage (e.g., via transistor, capacitor, processing defect leakage) will cause charges to bleed from the pad 1052, and thus the pad 1052's high voltage level will begin to decay (shown illustratively by FIG. 13's dropping "Vpad" waveform). The off-die tester 1002 will internally compare an inputted real-time pad voltage level to the Tester Vref waveform level), e.g., at periodic times or at one predetermined (elapsed) time.

Initially, a voltage level of the dropping Vpad waveform level will be higher than the Tester Vref voltage level, and thus a tester (comparison) output will initially be at a high voltage level (shown illustratively by FIG. 13's upper "Tester Output" horizontal waveform portion). At a point in time where the dropping Vpad voltage level substantially matches the Tester Vref voltage level, tester (comparison) output flips between high and low states (shown illustratively by FIG. 13's substantially vertical "Tester Output" portion), and thereafter, remains low (shown illustratively by FIG. 13's lower "Tester Output" horizontal portion).

Again, the off-die tester 1002 may output test data (shown illustratively by FIG. 10's TOUT arrow) once the above test has been completed, such test data containing information being indicative of a pass/fail of the circuit and/or IC, or containing information which can be used for determination of a pass/fail of the circuit and/or IC.

Figure 17:
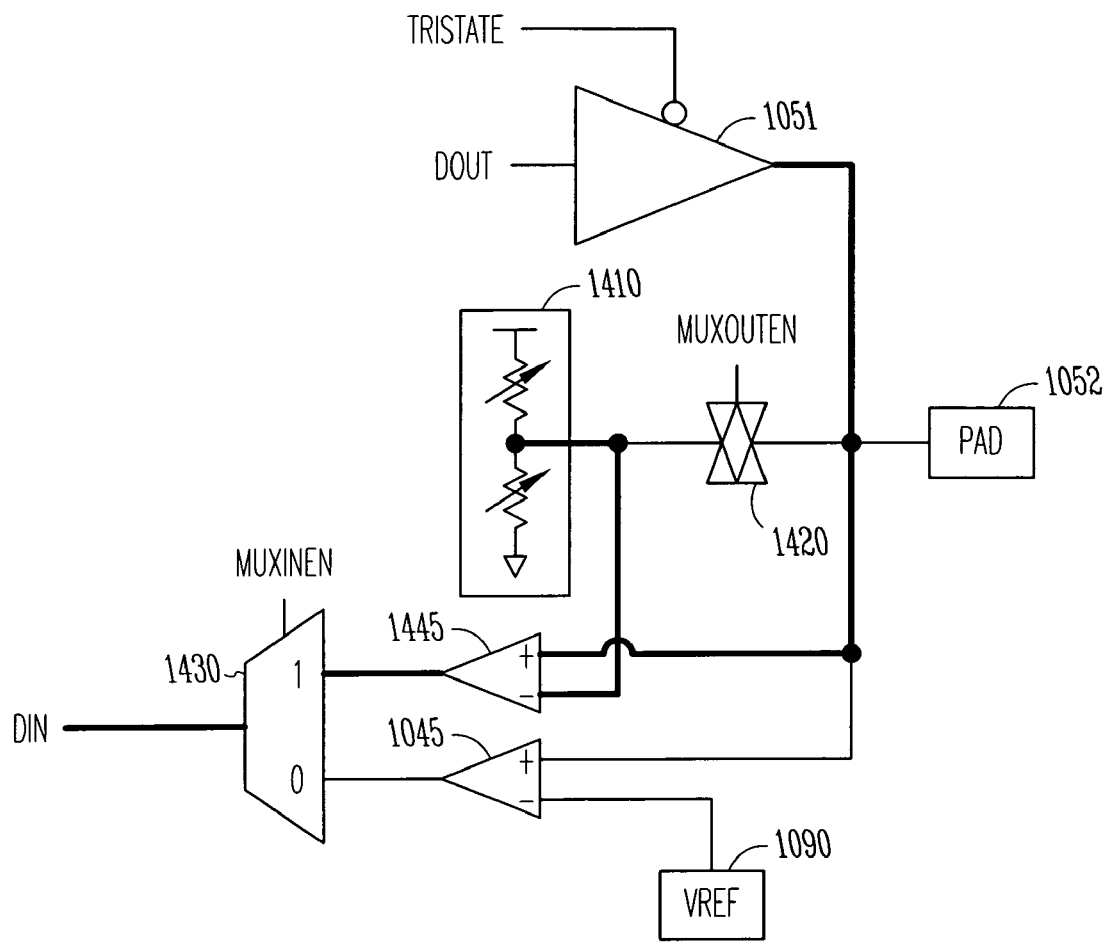

FIG. 17 (and the signals enclosed within parenthesis within FIG. 13) will now be used to describe how the FIG. 14 on-die generic output loop (I/O specification testing) circuit can be used to perform pad leakage testing without the need for the off-die (external) tester 1002. The testing control unit 1440 (and associated lines/signals) is again not shown in FIG. 17 in order to simplify such circuit. Within the simplified circuit, ones of the FIG. 17 components/paths used in input trip point testing may be shown in bolded (highlighted) form for the reader's ease in differentiating such components/paths.

To conduct pad leakage testing, the FIG. 17 output buffer/driver 1051 is momentarily turned on so as to drive a high voltage level onto the pad 1052, and is tristated thereafter so as to isolate the pad 1052 from the output buffer/driver 1051. Such driven pad voltage level is inputted into a first input of the input buffer/driver 1445 (shown illustratively by FIG. 13's upper horizontal portion of the Vpad waveform). A wide common-mode input buffer is used because in measuring a pad output drive value, the output drive may be either close to the supply rail or close to the ground which may not be able to be sensed by limited dynamic range of the GTL input buffer.

By suitable selection and/or programming of the FIG. 17's Vref Generator 1410, a voltage reference (e.g., equivalent to half the level of the pad's high voltage level) is set up and applied to another input of the buffer/driver 1445 (shown illustratively by FIG. 13's horizontal "Vref Gen's Vref" waveform). The pad 1052's high voltage level will begin to decay as previously described. The on-die input buffer/driver 1445 then begins to compare the dropping pad voltage level to the Vref Generator 1410's Vref voltage level, and passes a comparison result through the multiplexer 1430 and onto the DIN line. The on-die testing control unit 1440 (not shown in FIG. 15 for simplicity) may monitor a voltage level of FIG. 17's DIN line periodically or at a predetermined (elapsed) time.

Initially, a voltage level of the dropping Vpad waveform level will be higher than the Vref Gen's Vref voltage level, and thus a (comparison) output will initially be at a high voltage level (shown illustratively by FIG. 13's upper "DIN" horizontal waveform portion). At a point in time where the dropping Vpad voltage level substantially matches the Vref Gen's Vref voltage level, the input buffer/driver 1445's (comparison) output flips between high and low states (shown illustratively by FIG. 13's substantially vertical "DIN" waveform portion), and thereafter, remains low (shown illustratively by FIG. 13's lower "DIN" horizontal waveform portion).

The clocked time at which the on-die testing control unit 1440 detects that the output flips may represent the self-measured pad leakage characteristic. Since IO Loopback operation is synchronous, the entire operation is deterministic, enabling the on-die testing control unit 1440 and/or a designer to determine the leakage rate accurately.

The on-die testing control unit 1440 may store and/or output test data (shown illustratively by FIG. 14's TOUT' arrow) once the above test has been completed, such test data containing information being indicative of a pass/fail of the circuit and/or IC (e.g., after referencing an on-die stored look-up table), or containing information (such as the self-measured pin leakage time and/or level) which can be used for determination of a pass/fail of the circuit and/or IC. Such TOUT' test data may be provided to and analyzed by the IC's on-die processors (e.g., via a memory look-up table), or alternatively, may be passed off-die for analysis.

Figure 18:
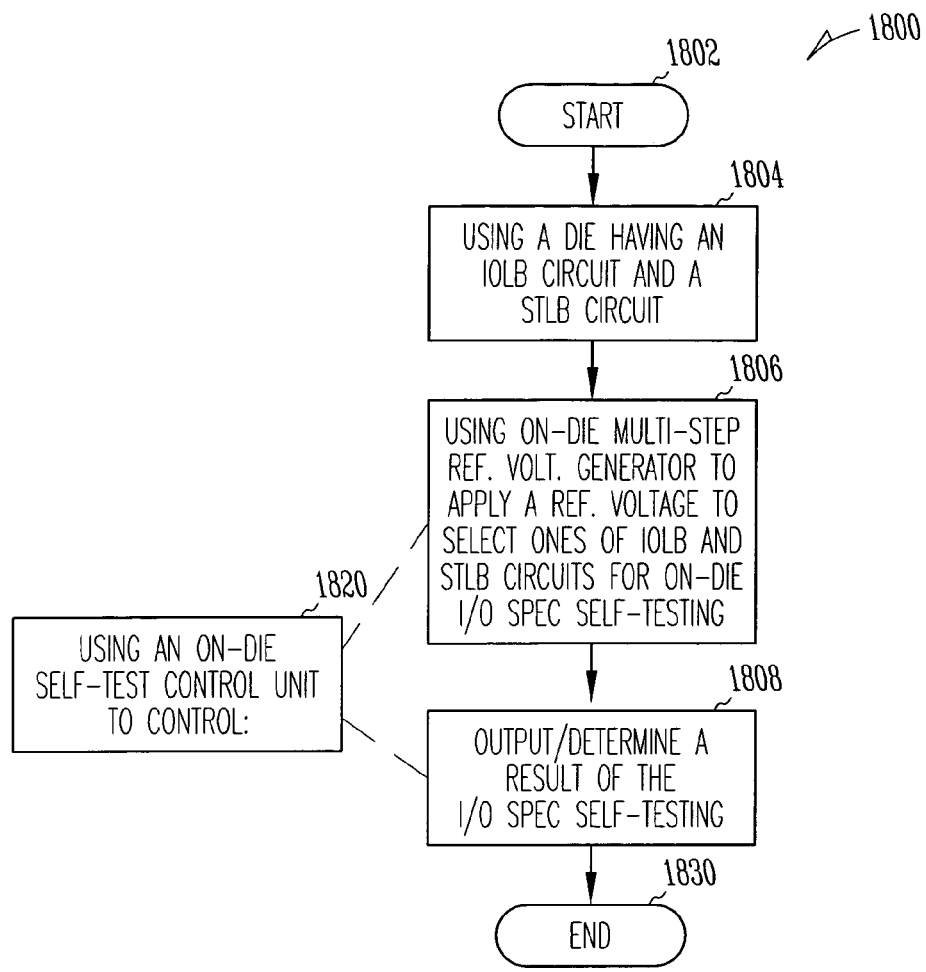
FIG. 18 is an example flow diagram of example operations useable with the FIGS. 14–17 example embodiments.

FIG. 18 is an example flow diagram 1800 of example operations useable with the FIGS. 14–17 example embodiments. More particularly, after a start 1802, a die having an on-die iolb circuit and on-die stlb circuit is used (block 1804). An on-die multi-step reference voltage generator is used (block 1806) to apply a reference voltage to select ones of the iolb and stib circuits to effect on-die I/O specification self-testing. Subsequently, there is an outputting/determination of a result of the I/O specification self-testing (block 1808). Block 1820 with dashed lines connected to blocks 1806 and 1808 is used to show that an optional on-die self-test control circuit may be used to control the operations of such connected-to blocks.

Figure 19:
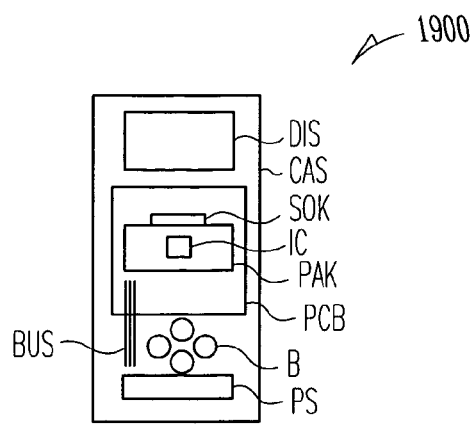
FIG. 19 illustrates example electronic systems of differing granularities that may include an embodiment of the present invention.

FIG. 19 illustrates example electronic system arrangements that may incorporate implementations of the present invention. More particularly, shown is an integrated circuit (IC) chip that may incorporate one or more implementations of the present invention as an IC chip system. Such IC may be part of an electronic package PAK incorporating the IC together with supportive components onto a substrate such as a printed circuit board (PCB) as a packaged system. The packaged system may be mounted, for example, via a socket SOK onto a system board (e.g., a motherboard system (MB)). The system board may be part of an overall electronic device (e.g., computer, electronic consumer device, server, communication equipment) system that may also include one or more of the following items: input (e.g., user) buttons B, an output (e.g., display DIS), a bus or bus portion BUS, a power supply arrangement PS, and a case CAS (e.g., plastic or metal chassis).

In beginning to conclude the FIGS. 10–19 discussions, novel arrangements having built-in self-test of I/O specifications has been presented. The new arrangements utilize an on-die programmable reference voltage for output and input level self-testing. One reference voltage generator and one wide-common-mode differential amplifier are added. An additional multiplexer is added to steer the voltage output. Since the self-measuring loop is a subset of IO loopback path, a same pattern generator and compare logic may be used for pattern generation and error detection.

In addition, since the test mode is controlled per-pin, it is possible to test one pin at a time while the rest of pins are switching in the iolb mode, mimicking simultaneous switching noise (SSN) and a cross-talk environment. Accordingly, equipped with an on-die tester replica along with the programmable strobe positioning from an iolb system (FIGS. 1–9), I/O specifications such as input trip-point, output drive-level and pin leakage can be measured accurately on-die. Whereas FIGS. 1–9 were more directed to self-measurement of ac I/O timing, FIGS. 10–18 are more directed to self-measurement of dc I/O specifications.

In utilizing a loopback mechanism with few additional parts, the arrangements offer the ability to validate I/O specifications entirely on-die or on lower-cost structure testers ($250K each) instead of functional testers ($3 million each). Hence the cost of test is significantly reduced, and the need for high-cost functional testers ($3 million each) may be able to be eliminated entirely in the future.

A summary of some advantages may be as follows: I/O specification validation and characterization may be performed entirely by the IC circuit and/or performed entirely in a (inexpensive) structural tester, eliminating dependency on having a (expensive) functional tester; the test mode is controlled per-pin allowing per-pin level characterization while the rest of the pins are exercised by IO loopback operation, thus emulating real-world source synchronous noise (SSN) and cross-talk environments; higher accuracy is achieved by a higher degree of resolution offered by internal circuitry and elimination of noisy tester trace; implementation is very simple and requires a very small number of transistors.

In addition to the iolb and characteristics testing arrangements of the present invention being useful for semiconductor die (e.g., chip) I/O testing during semiconductor manufacture and/or before die release to a purchaser, the testing arrangements may be useful for performing real-time I/O testing within electronic systems in which they are implemented. The testing may be performed at any predetermined time or times, e.g., upon every startup/initialization of the electronic system; upon user request; at periodic time intervals, etc. Upon detection of an I/O error/fault, the electronic apparatus may be constructed to output a predetermined I/O error/fault indication, e.g., a textual error message on the display DIS.

In concluding, reference in the specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment or component, it is submitted that it is within the purview of one skilled in the art to effect such feature, structure, or characteristic in connection with other ones of the embodiments and/or components. Furthermore, for ease of understanding, certain method procedures may have been delineated as separate procedures; however, these separately delineated procedures should not be construed as necessarily order dependent in their performance, i.e., some procedures may be able to be performed in an alternative ordering, simultaneously, etc.

This concludes the description of the example embodiments. Although the present invention has been described with reference to a number of illustrative embodiments thereof, it should be understood that numerous other modifications and embodiments can be devised by those skilled in the art.

The invention claimed is:

1. An on-die circuit comprising:
    an input/output loop-back (iolb) circuit to perform input/output (I/O) to an input/output connection;
    a multi-step reference voltage generator circuit selectively connectable to apply a reference voltage output thereof to the iolb circuit to perform self-test of at least one input/output (I/O) specification of the die;
    a normal input buffer provided along the iolb circuit to receive at least a non-self-test input from the input/output connection;
    a self-test input buffer to receive self-test iolb input from the iolb circuit on a first input thereof; and
    where the multi-step reference voltage generator circuit is selectably connectable to apply the reference voltage output thereof to a second input of the self-test input buffer.

2. An on-die circuit as claimed in claim 1, where the multi-step reference voltage generator circuit is selectively connectable to apply a multi-step reference voltage output thereof to the self-test input buffer to perform an output drive level self-test of the die.

3. An on-die circuit as claimed in claim 2, comprising:
    a self-test control unit to control operation of the multi-step reference voltage generator circuit, and to control operation of the output drive level self-test.

4. An on-die circuit as claimed in claim 1, where the multi-step reference voltage generator circuit is selectively connectable to apply a static reference voltage level output thereof to the self-test input buffer to perform a connection leakage self-test of the die.

5. An on-die circuit as claimed in claim 4, comprising:
a self-test control unit to control operation of the multi-step reference voltage generator circuit, and to control operation of the connection leakage self-test.

6. An on-die circuit comprising:
an input/output loop-back (iolb) means for performing input/output (I/O) to an input/output connection;
a multi-step reference voltage generator means selectively connectable for applying a reference voltage output thereof to the iolb means to perform self-test of at least one input/output (I/O) specification of the die;
a normal input buffer provided along the iolb means to receive at least a non-self-test input from the input/output connection;
a self-test input buffer means for receiving self-test iolb input from the iolb means on a first input thereof; and
where the multi-step reference voltage generator means is selectably connectable for applying the reference voltage output thereof to a second input of the self-test input buffer.

7. An on-die circuit as claimed in claim 6, where the multi-step reference voltage generator means is selectively connectable for applying a multi-step reference voltage output thereof to the self-test input buffer for performing an output drive level self-test of the die.

8. An on-die circuit as claimed in claim 7, comprising:
a self-test control means for controlling operation of the multi-step reference voltage generator circuit, and for controlling operation of the output drive level self-test.

9. An on-die circuit as claimed in claim 6, where the multi-step reference voltage generator means is selectively connectable for applying a static reference voltage level output thereof to the self-test input buffer for performing a connection leakage self-test of the die.

10. An on-die circuit as claimed in claim 9, comprising:
a self-test control means for controlling operation of the multi-step reference voltage generator circuit, and for controlling operation of the connection leakage self-test.

11. A system comprising:
at least one item selected from a list of: an electronic package, PCB, socket, bus portion, input device, output device, power supply arrangement and case; and
an integrated circuit comprising:
an input/output loop-back (iolb) circuit to perform input/output (I/O) to an input/output connection;
a multi-step reference voltage generator circuit selectively connectable to apply a reference voltage output thereof to the iolb circuit to perform self-test of at least one input/output (I/O) specification of the die;
a normal input buffer provided along the iolb circuit to receive at least a non-self-test input from the input/output connection;
a self-test input buffer to receive self-test iolb input from the iolb circuit on a first input thereof; and
where the multi-step reference voltage generator circuit is selectably connectable to apply the reference voltage output thereof to a second input of the self-test input buffer.

12. A system as claimed in claim 11, where the multi-step reference voltage generator circuit is selectively connectable to apply a multi-step reference voltage output thereof to the self-test input buffer to perform an output drive level self-test of the die.

13. A system as claimed in claim 12, comprising:
a self-test control unit to control operation of the multi-step reference voltage generator circuit, and to control operation of the output drive level self-test.

14. A system as claimed in claim 11, where the multi-step reference voltage generator circuit is selectively connectable to apply a static reference voltage level output thereof to the self-test input buffer to perform a connection leakage self-test of the die.

15. A system as claimed in claim 14, comprising:
a self-test control unit to control operation of the multi-step reference voltage generator circuit, and to control operation of the connection leakage self-test.

16. A method comprising:
using a die which includes an input/output loop-back (iolb) circuit to perform input/output (I/O) to an input/output connection;
applying a reference voltage output to the iolb circuit using an on-die multi-step reference voltage generator circuit to perform self-test of at least one input/output (I/O) specification of the die;
having a normal input buffer provided along the iolb circuit to receive at least a non-self-test input from the input/output connection;
having a self-test input buffer receiving self-test iolb input from the iolb circuit on a first input thereof; and
applying the reference voltage output of the multi-step reference voltage generator circuit to a second input of the self-test input buffer.

17. A method as claimed in claim 16, comprising applying a multi-step reference voltage output of the multi-step reference voltage generator circuit to the self-test input buffer to perform an output drive level self-test of the die.

18. A method as claimed in claim 17, comprising:
using an on-die self-test control unit to control operation of the multi-step reference voltage generator circuit, and to control operation of the output drive level self-test.

19. A method as claimed in claim 16, comprising applying a static reference voltage level output of the multi-step reference voltage generator circuit to the self-test input buffer to perform a connection leakage self-test of the die.

20. A method as claimed in claim 19, comprising:
using an on-die self-test control unit to control operation of the multi-step reference voltage generator circuit, and to control operation of the connection leakage self-test.

* * * * *